(12) United States Patent
Yamashita

(10) Patent No.: US 7,550,819 B2
(45) Date of Patent: Jun. 23, 2009

(54) METAL THIN-FILM RESISTANCE ELEMENT ON AN INSULATION FILM

(75) Inventor: Kimihiko Yamashita, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 430 days.

(21) Appl. No.: 11/061,548

(22) Filed: Feb. 18, 2005

(65) Prior Publication Data

US 2005/0202219 A1  Sep. 15, 2005

(30) Foreign Application Priority Data

Feb. 19, 2004  (JP) .............................. 2004-042782

(51) Int. Cl.
*H01L 29/00* (2006.01)
(52) U.S. Cl. .............. 257/536; 257/E21.004; 257/E21.006
(58) Field of Classification Search ................. 257/536, 257/E21.004, E21.006
See application file for complete search history.

(56) References Cited

U.S. PATENT DOCUMENTS

| 5,342,808 A | * | 8/1994 | Brigham et al. ............. 438/694 |
| 5,364,817 A | * | 11/1994 | Lur et al. ..................... 438/644 |
| 6,717,233 B1 | * | 4/2004 | Haddad et al. .............. 257/536 |
| 6,727,556 B2 | * | 4/2004 | Shiiki et al. ................. 257/358 |
| 6,759,729 B1 | * | 7/2004 | Racanelli et al. ............ 257/536 |

FOREIGN PATENT DOCUMENTS

| JP | 58-148443 | 9/1983 |
| JP | 61-100956 | 5/1986 |
| JP | 2699559 | 4/1997 |
| JP | 2932940 | 5/1999 |
| JP | 3185677 | 5/2001 |
| JP | 2002-124639 | 4/2002 |
| JP | 2002-261237 | 9/2002 |

* cited by examiner

*Primary Examiner*—Howard Weiss
(74) *Attorney, Agent, or Firm*—Dickstein Shapiro LLP

(57) ABSTRACT

A semiconductor device having a metal thin-film resistance on an insulation film includes first and second contact holes formed in the insulation film, a first conductive plug formed in the first contact hole, a second conductive plug formed in the second contact hole simultaneously to formation of the first conductive plug, a metal thin-film resistance formed on the first conductive plug and on the insulation film, and a metal interconnection pattern formed on the second conductive plug and the insulation film.

9 Claims, 22 Drawing Sheets

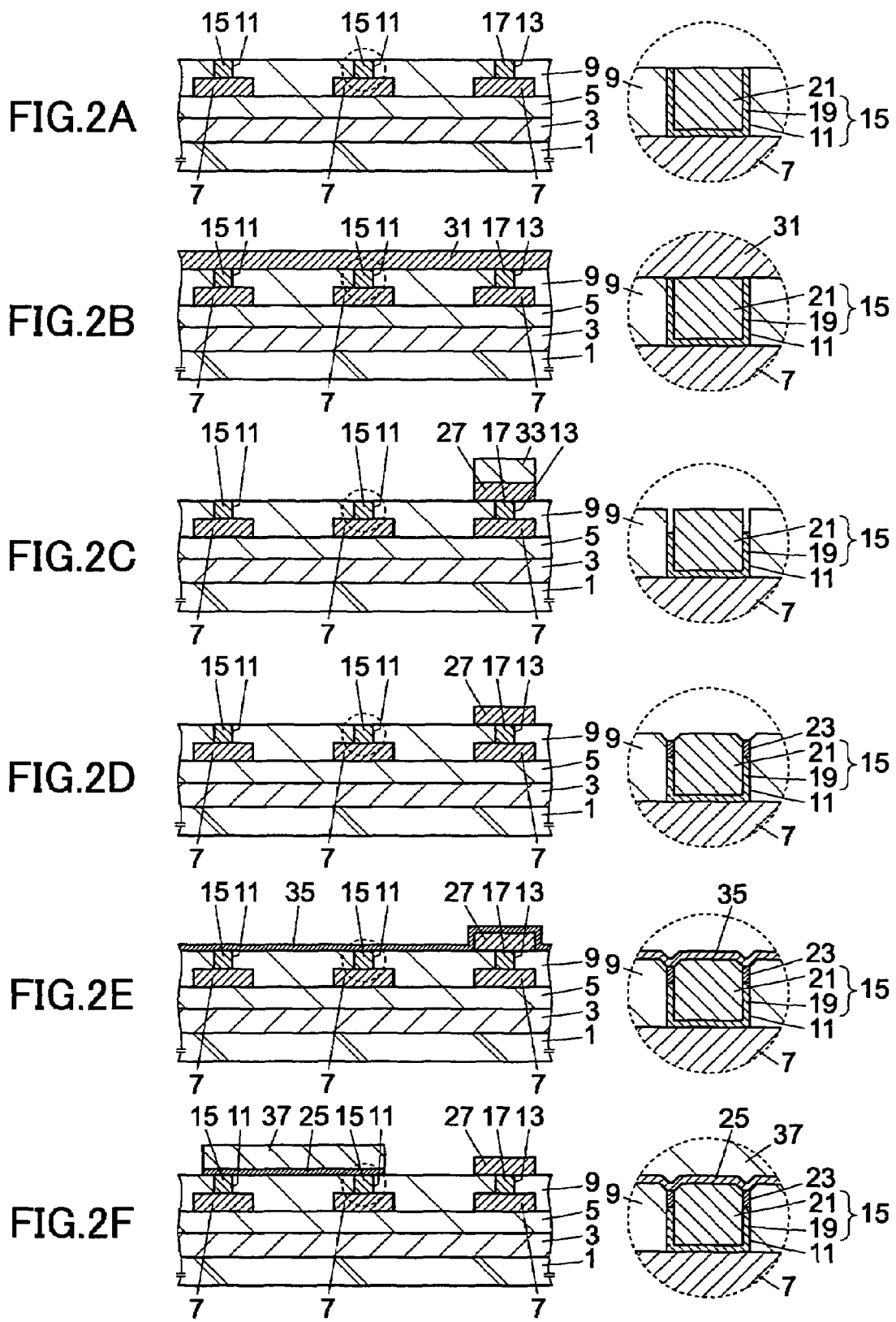

METAL THIN-FILM RESISTANCE ELEMENT ON AN INSULATION FILM

BACKGROUND OF THE INVENTION

The present invention relates to semiconductor device and fabrication process thereof, and more particularly to a semiconductor device having a metal thin-film resistance element formed of a metal thin-film, which in turn is formed on an insulation film.

Resistance elements constitute an important part of an analog integrated circuit.

Particularly, a resistance element of a metal thin-film (called hereinafter as metal thin-film resistance) attracts attention in view of its small temperature dependence of the resistance value (TCR).

For the material of such metal thin-film resistance, chromium-silicon (CrSi), nickel chromium (NiCr), tantalum nitride (TaN), chromium silicide (CrSi2), chromium silicide nitride (CrSiN), chromium silicon oxy (CrSiO), and the like, are used.

With a semiconductor device having such a metal thin-film resistance, it is generally practiced to form the metal thin-film resistance with a very small thickness of 1000 Angstroms or less in order to meet for the demand of high integration density and for higher sheet resistance.

Conventionally, following methods are known for achieving electrical connect with a metal thin-film resistance:

1) Directly connecting a metal interconnection pattern to the metal thin-film resistance (Patent Reference 1);

2) Forming an interlayer insulation film after formation of the metal thin-film resistance; forming a contact hole in the interlayer insulation film; and connect a metal interconnection via the foregoing contact hole (Patent Reference 2 and Patent Reference 3).

3) Forming a barrier layer on the metal thin-film resistance and connecting a metal interconnection to such a barrier film (Patent Reference 4 and Patent Reference 5); and 4) Forming an electrode in a contact hole formed in an insulation film, forming a resistance film on the insulation film, and forming a pattern of the resistance body by applying an anisotropic etching process to the resistance film such that the resistance pattern makes a contact with the electrode (Patent Reference 1).

Hereinafter, the method of achieving electrical connection to the metal thin-film resistance of the prior art 1)-4) above will be explained.

First, the method 1) of forming a metal interconnection directly on a metal thin-film resistance will be explained with reference to FIGS. 22A-22F.

(1) Referring to FIG. 22A, a BPSG (borophospho-silicate film) film 5 is formed on a silicon substrate 1 still having the form of wafer, on which a device isolation oxide film 3 and active devices such as transistors are formed, as a first interlayer insulation film 5 located between the gate electrode of the transistors and a metal interconnection pattern. Further, a reflowing processing, and the like, is conducted.

(2) Next, in the step of FIG. 22B, a metal thin-film 73 used for the metal thin-film resistance is formed on the entire surface of the silicon substrate 1 with the thickness of 20-500 Angstroms.

Further, in the step of FIG. 22C, there is formed a resist pattern 75 on the metal then film 73 so as to define the region in which the metal thin-film resistance is to be formed, followed by a patterning process of the metal thin-film 73 while using the resist pattern 75 as a mask, to form a metal thin-film resistance 77.

(4) After removing the resist pattern 75, a metal film 79 of an AlSiCu alloy used for the interconnection pattern is formed on the entire surface of the first interlayer insulation film 5 including the metal thin-film resistance 77 as represented in FIG. 22D. Further, there is formed a resist pattern 81 on the metal film 79 for patterning the same such that the interconnection metal film 79 remains at both end parts of the metal thin-film resistance 77.

(5) Further, in the step of FIG. 22E, the interconnection metal film 79 is patterned while using the resist pattern 81 as a mask, to form a metal interconnection pattern 83. Thereby, it should be noted that, in the general fabrication process of semiconductor devices, a dry etching technology will be used in the etching process of such an interconnection metal film 79, while in the present case in which there exists a very thin metal thin-film resistance 77 underneath the interconnection metal film 79, there arises a problem that the metal thin-film resistance 77 may be etched at the time of the overetching process when a dry etching process is used. Thus, it is not possible to use a dry etching process in the foregoing process of FIG. 22E, and the interconnection metal film 79 has to be patterned by using a wet etching process.

(6) Further, by removing the resist pattern 81 in the step of FIG. 22F, formation of the metal thin-film resistance 77 having the metal interconnection patterns 83 connected to the metal thin-film resistance 77 is completed.

Next, the method 2) of forming the interlayer insulation film after formation of the metal thin-film resistance, forming the contact hole in the interlayer insulation film, and connecting a metal interconnection pattern via the contact hole, will be explained with reference to FIGS. 23A-23F.

(1) Similarly to the steps (1)-(3) explained previously with reference to FIGS. 22A-22C, there are formed a device isolation oxide film 3, a first interlayer insulation film 5 and a metal thin-film resistance on a silicon substrate in the step of FIG. 23A.

(2) Next, in the step of FIG. 23B, there is formed a CVD (chemical vapor deposition) oxide film 85 on the first interlayer insulation film 5 including the metal thin-film resistance 77 as an interlayer insulation film for the metal interconnection with the thickness of about 2000 Angstroms.

(3) Next, in the step of FIG. 23C, there is formed a resist pattern 87 having an opening in correspondence to respective ends of the metal thin-film resistance 77 on the CVD oxide film 85 for the formation of the contact holes for the metal interconnection patterns. Further, by using the resist pattern 87 as a mask, the CVD oxide film 85 is subjected to a wet etching process to form contact holes 89. Here, it should be noted that, in the general fabrication process of semiconductor devices, a dry etching technology will be used in the etching process for formation of the contact holes 89, while in the present case in which there exists a very thin metal thin-film resistance 77 having the thickness of 1000 Angstroms or less, it is difficult to prevent the problem of the contact holes 89 penetrating through the metal thin-film resistance 77 with such a dry etching process, and it is necessary to use a wet etching process for forming the contact holes 89.

(4) Next, in the step of FIG. 23D, an interconnection metal film of an AlSiCu alloy is formed on the CVD oxide film 85 including the interior of the contact holes 89.

(5) Next, in the step of FIG. 23E, a resist pattern 93 is formed on the interconnection metal film 91 for patterning the interconnection metal film 91 such that the interconnection metal film remains at both ends of the metal thin-film resistance 77.

(6) Further, a dry etching process is applied in the step of FIG. 23F to pattern the interconnection metal film 91 while using the resist pattern 93 as a mask, to form metal interconnection patterns 95. In this dry etching process, there arises no problem that the metal thin-film resistance 77 is etched even when a dry etching process is used because of the existence of the CVD oxide film 85 underneath the interconnection metal film 91. After removal of the resist pattern 93, formation of the metal interconnection pattern 95 for electrical interconnection between the metal thin-film resistance 77 and the metal interconnection pattern 95 is completed.

Next, the method 3) of forming a barrier film on the metal thin-film resistance and connecting a metal interconnection to such a barrier film will be described with reference to FIGS. 24A-24E.

(1) Similarly to the steps (1)-(3) explained with reference to FIGS. 22A-22C, the device isolation oxide film 3, the first interlayer insulation film 5 and the metal thin-film resistance 77 are formed on the silicon substrate in the step of FIG. 24A.

(2) Next, in the step of FIG. 24B, a refractory metal film 97 of TiW, or the like, is formed on the first interlayer insulation film 5 including the metal thin-film resistance 77 as the barrier film of the metal interconnection, and an interconnection metal film 99 of an AlSi or AlSiCu alloy is formed further thereon.

(3) Next, in the step of FIG. 24C, there is formed a resist pattern 101 on the interconnection metal film 99 for patterning the interconnection metal film 99 such that the interconnection metal film 99 remains at both lateral ends of the metal thin-film resistance 77.

(4) Further, while using the resist pattern 101 as a mask, the interconnection metal film 99 is patterned by a dry etching process to form a metal interconnection pattern 103 as shown n FIG. 24D. In this process, there is no risk of the metal thin-film resistance 77 being etched even when the etching is conducted by a dry etching process because of the existence of the refractory metal film 97 underneath the interconnection metal film 99.

(5) Next, in the step of FIG. 24E, the resist pattern 101 is removed and the refractory metal film 97 is removed selectively by a wet etching process while using the metal interconnection pattern 103 as a mask, to form a refractory metal film pattern 105. With this, formation of the metal thin-film resistance body 77, the metal interconnection pattern 103 in electrical connection with the metal thin-film interconnection body 77 and the refractory metal film pattern 105 is completed. Here, it should be noted that, because the refractory metal film 97 is provided immediately on the metal thin-film resistance 77, patterning of the refractory metal film 97 by a dry etching process is difficult.

Next, the method 4) of forming an electrode in a contact hole formed in an insulation film and then forming a resistance pattern by an anisotropic etching process of a resist film formed on the insulation film such that the resistance pattern is connected to the electrode, will be explained with reference to FIGS. 25A-25E. Here, explanation will be made for the case of forming a metal interconnection pattern further on the metal interconnection pattern formed underneath the contact hole.

(1) Referring to FIG. 25A, there is formed a BPSG film on a silicon substrate still in the form of wafer on which formation of a device isolation oxide film 3 and transistors (not illustrated) is completed, as a first interlayer insulation film between the gate electrode of the transistor and the metal interconnection pattern. Further, reflowing is conducted and a metal interconnection pattern 107 is formed on the first interlayer insulation film 5. On the first interlayer insulation film 5, there is formed an insulation film 109, and after planarization of the top surface of the insulation film 109, there are formed first contact holes 111 in the insulation film 109 in the parts thereon located on the metal interconnection patterns 107 disposed at both ends of the metal thin-film resistance. Here, it should be noted that there is formed no contact hole for connecting the metal interconnection patterns 107 with the upper layer metal interconnection patterns to be formed later by a latter process. Thereafter, the first contact holes 111 are filled with a conductive material and there formed first conductive plugs 113.

(2) Next, in the step of FIG. 25B, a metal thin-film is provided on the entire surface of the insulation film 109 for formation of the metal thin-film resistance, wherein the metal film thus formed is patterned to form the metal-thin film resistance 77 by conducting an anisotropic etching process while using a resist pattern formed on the foregoing metal thin-film for defining the region where the metal thin-film resistance is to be formed, as a mask.

(3) Next, in the step of FIG. 25C, an insulation film 115 is formed on the entire surface of the insulation film 109 so as to include the formation region of the metal thin-film resistance 77, wherein it should be noted that this insulation film 115 is formed for the purpose of preventing the etching of the metal thin-film resistance 77 at the time of the anisotropic etching process for patterning the upper metal interconnection pattern formed by the later process. It should be noted that the insulation film 109 and the insulation film 115 constitute a second interlayer insulation film.

(4) Next, in the step of FIG. 25D, there is formed a second contact hole 117 in the insulation films 109 and 115 on the metal interconnection pattern 107 in the region different from the region in which the metal thin-film resistance 77 is formed, for the purpose of electrical connection with the foregoing upper metal interconnection pattern. Thereafter, the second contact hole 117 is filled with the conductive material and the second conductive plug 119 is formed.

(5) Next, in the step of FIG. 25E, a metal film for the upper metal interconnection pattern is formed on the insulation film 115 including the region where the second conductive plug 119 is formed, and an upper metal interconnection pattern 121 is formed as a result of patterning conducted by a photolithographic process and an anisotropic etching process such that the metal interconnection pattern 121 covers a predetermined region of the insulation film including the region where the second conductive plug 119 is formed. In this process, it should be noted that etching of the metal thin-film resistance 77 is prevented by the insulation film 115 covering the metal thin-film insulation film 77.

Further, there is a proposal of a semiconductor integrated circuit device for example in Patent Reference 6, in which there is formed a resistance body (not a metal thin-film resistance) on an insulation film covering an uppermost interconnection electrode in electrical connection with such an uppermost interconnection electrode.

Hereinafter, the method will be explained in which such a structure is applied to a metal thin-film resistance with reference to FIGS. 26A-26D.

(1) Referring to FIG. 26A, a BPSG film 5 is formed on a silicon substrate 1 still in the form of wafer on which a device isolation oxide film 3 and transistors (not shown) are formed, as a first interlayer insulation film located between the gate electrode of the transistor and a metal interconnection pattern. Thereafter, a reflowing process is conducted, and there are further formed a metal interconnection pattern 107 and a second interlayer insulation film 123 on the first interlayer insulation film 5, wherein the second interlayer insulation film 123 is formed consecutively of a CVD oxide film, an SOG (spin-on-glass) film formed on the CVD oxide film and another CVD oxide film formed on the SOG film. In FIGS. 26A-26D, it should be noted that the lower CVD oxide film, the SOG film and the upper CVD oxide film are represented collectively as the second interlayer insulation film 123.

(2) Next, in the step of FIG. 26B, there is formed a resist pattern 125 for defining the region for a contact hole in the second interlayer insulation film 123.

(3) Next, in the step of FIG. 26C, the second interlayer insulation film 123 is selectively removed while using the resist pattern 125 as a mask, and with this, there is formed a contact hole 127 in the second interlayer insulation film 123 on the metal interconnection pattern 107. Here, it should be noted that a part at the upper side of the metal interconnection pattern 107 is removed as a result of the overetching.

(4) Next, in the step of FIG. 26D, there is formed a metal thin-film 129 for the metal thin-film resistance on the entire surface of the second interlayer insulation film 123 including the region where the contact hole 127 is formed, with the thickness of 20-500 Angstroms. Thereafter, the metal thin-film 129 is patterned to form the metal thin-film resistance having a predetermined shape.

Further, there is a proposal of a semiconductor device having a metal thin-film resistance in the form of a semiconductor integrated circuit that carries the metal thin-film resistance on an insulation film as set forth in Patent Reference 7, for example, in which contact is achieved between the electrode part of the metal thin-film resistance and the metal interconnection pattern at an edge part or at least a part of the top surface of the metal interconnection pattern.

References
  Patent Reference 1 Japanese Laid-Open Patent Application 2002-124639 Official Gazette
  Patent Reference 2 Japanese Laid-Open Patent Application 2002-261237 Official Gazette
  Patent Reference 3 Japanese Patent 2,699,559
  Patent Reference 4 Japanese Patent 2,932,940
  Patent Reference 5 Japanese Patent 3,185,677
  Patent Reference 6 Japanese Laid-Open Patent Application 58-148443 Official Gazette
  Patent Reference 7 Japanese Laid-Open Patent Application 61-100956 Official Gazette

SUMMARY OF THE INVENTION

With the foregoing method 1), in which the metal interconnection pattern 83 is formed directly on the metal thin-film resistance 77, there arises a problem in the step 5 explained with reference to FIG. 22E in that patterning of the interconnection metal film 79 cannot be achieved by using a dry etching process, while this limitation leads to the problems that it is difficult to form highly miniaturized patterns and that increase of integration density of the integrated circuit is difficult.

Further, the metal thin-film body 77 is susceptible to oxidation, and it is difficult to achieve satisfactory electrical connection between the metal thin-film resistance 77 and the metal interconnection pattern 83 when the interconnection metal film 79 is formed in the state in which the surface of the metal thin-film resistance is oxidized. Here, it should be noted that in general fabrication process of semiconductor device, it is possible to achieve satisfactory electrical connection with a metal interconnection by removing the native oxide film on the surface of silicon substrate by a wet etching process using a hydrofluoric aqueous solution, while such a conventional approach cannot be used with such a structure in view of the fact that the metal thin-film resistance 77 is easily etched by a hydrofluoric acid and further in view of the possibility that there would be caused variation of resistance value in the metal thin-film resistance 77 when such an oxide removal process is conducted in preparation of formation of the interconnection metal film 79 by using a hydrofluoric acid in the step (4) explained with reference to FIG. 22D.

With the method 2) noted above, it is possible to carry out the patterning of the interconnection metal film 91 of the step (6) explained with reference to FIG. 23F by a dry etching process, by forming the interlayer insulation film 85 on the metal thin-film resistance 77.

However, with regard to the step (3) explained with reference to FIG. 23C, it is necessary to form the contact hole 89, used for the electrical interconnection between the metal thin-film resistance 77 and the metal interconnection pattern 95, by way of a wet etching process, while the use of wet etching process causes difficulty in increasing the integration density by device miniaturization. Further, the use of the wet etching process for the formation of the contact hole 89 raises the problem of increased number of steps in view of the necessity of additional processes of forming a barrier film on the metal thin-film resistance 77 and patterning such a barrier film for preventing the metal thin-film resistance 77 to be etched by hydrofluoric acid.

With the method 3) noted above, on the other hand, it becomes possible to carry out the etching process of the interconnection metal film by using a dry etching process as explained for the step (4) explained with reference to FIG. 24D. Further, formation of the contact hole is not necessary.

However, with the step (5) explained with reference to FIG. 24E, there is a need of carrying out the patterning of the refractory metal film 97 for forming the refractory metal film pattern, which substantially determines the length of the metal thin-film resistance 77, by using a wet etching process. Thereby, the refractory metal film 97 is etched with increased amount in the lateral direction, while this leads to he problem of increased variation of the resistance value and difficulty in forming highly miniaturized pattern.

Further, with the step (2) explained before with reference to FIG. 24B, the surface of the metal thin-film resistance 77 formed in advance of the refractory metal film 97 is oxidized, and it becomes necessary to remove the oxide film from the surface of the metal thin-film resistance 77 by using a hydrofluoric acid solution for achieving satisfactory electrical connection to the refractory metal film 97, while such oxide removal process conducted in advance of formation of the refractory metal film 97 by hydrofluoric acid tends to cause the problem of increased variation of the metal thin-film resistance 77.

Thus, with the conventional methods 1)-3) noted before, there is needed a wet etching process in any of the process steps in view of the small thickness of the metal thin-film resistance, and there has been caused the problem of difficulty in device miniaturization or large variation of the resistance value.

Further, in view of the easiness of oxidation of the metal thin-film resistance, there arises difficulty in forming good electrical interconnection between the metal thin-film resistance and the metal interconnection. Thereby, there has been the need of additional steps such as formation of a barrier film dedicated to the metal thin-film resistance or the removal process of surface oxide film by using a hydrofluoric acid solution. Further, there arises the problem of increased variation of the resistance value.

With the conventional process 4), on the other hand, it becomes necessary to form the second contact hole 117 and second conductive plug 119 in addition to the first contact hole 111 and the first conductive plug 113 used for connecting the metal interconnection pattern 107 and the metal thin-film resistance 77, in order to connect the metal interconnection patterns 107 and 121 with each other, while such an additional process increases the number of the fabrication steps.

Further, in order to prevent etching of the metal thin-film resistance 77 at the time of formation of the upper metal interconnection pattern 121, there is a need of forming the insulation film 115 after the formation of the metal thin-film resistance 77, while such formation of the insulation film 115 causes increase of additional steps such as CVD process or CMP (chemical mechanical polishing) process for planarization.

Further, there has been a problem with such a conventional method, in relation to the additional step of forming the insulation film 115, in that there is caused increase of through hole resistance because of the increased aspect ratio of the second contact hole 117 used for connecting the metal interconnection patterns 107 and 112 with each other.

Further, in the case the construction disclosed in Patent Reference 6, which uses a resistance formed on the uppermost interconnection electrode via an insulation film in connection with the foregoing uppermost interconnection electrode, to the metal thin-film resistance, there arises a problem in that the step coverage of the metal film 129 is deteriorated in the inner surface of the contact hole 127, particularly at the bottom part of the contact hole 127 as represented in FIG. 26D. Thereby, the contact resistance between the metal thin-film resistance and the metal interconnection pattern 107 is increased or variation of the contact resistance is increased. Further, because of the variation of depth of the contact holes formed on the wafer surface, there also arise problems such as the diameter or step coverage of the contact hole varies, while such a variation leads to the variation of the contact resistance.

Further, with the integrated circuit disclosed in Patent Reference 7, in which the electrode part of the metal thin-film resistance is formed so as to cover the end part of the metal interconnection at the edge surface or top surface thereof, there arises a problem of poor step coverage for the metal thin-film resistance at the step formed by the end surface of the metal interconnection, while such poor step coverage leads to the problem of increased resistance and increased variation of the metal thin-film resistance. Further, there may be formed disconnection of the metal thin-film resistance.

Accordingly, it is the object of the present invention to provide a semiconductor device having a metal thin-film resistance and a fabrication process thereof capable of providing a stable resistance value for the metal thin-film resistance without inviting significant increase of number of steps for fabricating the semiconductor device.

According to a first mode of the present invention, there is provided a semiconductor device having a metal thin-film resistance on an insulation film, comprising first and second contact holes formed in the insulation film, a first conductive plug formed in the first contact hole, a second conductive plug formed in the second contact hole simultaneously to the first conductive plug, the metal thin-film resistance formed on the first conductive plug and the insulation film, and a metal interconnection pattern formed on the second conductive plug an the insulation film.

In the semiconductor device according to the first mode of the present invention, each of the first and second conductive plugs may be formed of a first conductive material formed on an inner wall of any of the first and second contact holes and a second conductive material formed on the first conductive material, a top end of the first conductive material being formed, in the first contact hole, with a separation from a top edge of the first contact hole and further from a top surface of the second conductive material, an outer periphery defining the top surface of the second conductive material and a top edge of the first contact hole having tapered form, wherein there is formed a buried material, in a space between the inner wall of the first contact hole and the second material, the buried material containing at least a material of the insulation film, a material of the first conductive material and Ar (argon). Here, it should be noted that the foregoing tapered form and the buried material can be formed by applying an Ar sputter etching process to the insulation film at the time of selectively removing the metal film for the metal interconnection pattern formed on the first conductive plug in the state that the upper part of the first conductive material constituting the first conductive plug is removed and there is formed a depression around the first conductive plug.

Further, it is possible to construct the semiconductor device such that there is provided a metal nitride film covering the top surface of the metal thin-film resistance in such a manner that no metal oxide film is formed between the top surface of the metal thin-film resistance and the metal nitride film.

According to a second mode of the present invention, there is further provided a protective insulation film on the metal thin-film resistance in the foregoing first mode of the present invention.

Further, it is also possible to construct the semiconductor device such that the metal nitride film is provided between the metal thin-film resistance and the foregoing protective insulation film in such a manner that there is formed no metal oxide film between the top surface of the metal thin-film resistance and the metal nitride film.

In the second mode of the present invention, it is also possible to provide the metal nitride film as the foregoing protective insulation film in such a manner that there is formed no metal oxide film between the top surface of the metal thin-film resistance and the metal nitride film.

In the first and second modes of the present invention noted above, it is also possible to construct the semiconductor device such that the metal interconnection pattern constitutes the uppermost metal interconnection pattern.

The semiconductor device of the present invention can be applied for example to a semiconductor device having a voltage divider including two or more resistance elements in which a desired voltage is obtained by disconnecting a fuse. In such a semiconductor device, the resistance elements constituting the voltage divider are provided by means of the metal thin-film resistance explained heretofore.

Further, the semiconductor device of the present invention may be used also for a semiconductor device that includes: a voltage divider for dividing an input voltage into a divided voltage; a reference voltage generator producing a reference voltage; and a comparator circuit comparing the divided voltage from the voltage divider with the reference voltage from the reference voltage generator. Here, the voltage divider includes the resistance elements formed of the metal thin-film resistance constituting the semiconductor device of the present invention.

Further, the semiconductor device of the present invention can be used also for a semiconductor device that includes an output driver for controlling output of an input voltage; a voltage divider for dividing an output voltage to obtain a divided voltage; a reference voltage generator for producing a reference voltage; and a constant voltage generator including a comparator circuit, the comparator comparing the divided voltage from the voltage divider and the reference voltage from the reference voltage generator, the comparator further controlling the operation of an output driver in response to a result of comparison. Thereby, the voltage divider constituting the constant voltage generator is provided by using the metal thin-film resistance of the semiconductor device of the present invention.

Further, the fabrication process of the semiconductor device of the present invention, which includes a metal thin-film resistance on an insulation film, includes the following fabrication steps (A))-(D) of:

(A) forming first and second contact holes in the insulation film;

forming a first conductive plug in the first contact hole and a second conductive plug in the second contact hole by filling the first and second conductive plugs with a conductive material;

(C) forming a metal film for a metal interconnection pattern on the insulation film so as to include at least the region where the second conductive plug is formed, and forming the metal interconnection pattern by patterning the metal film such that the metal interconnection pattern is formed on the second conductive plug and further on the insulation film; and (D) forming a metal thin-film for a metal thin-film resistance on the insulation film so as to include at least a region where the first conductive plug is formed, and forming the metal thin-film resistance on the first conductive plug and the insulation film by patterning the metal thin-film.

According to a first aspect of the fabrication method of the present invention, it is also possible to apply an Ar sputter etching process to the insulation film in the step of forming the metal thin-film resistance before the step of forming the metal thin-film.

Further, it is possible to carry out the foregoing Ar sputter etching process with a depth corresponding to 25 Angstroms or more in terms of the etching depth of a thermal oxide film.

Further, it is also possible to form a laminated structure of a metal nitride pattern and the metal thin-film resistance: by forming a metal nitride film, after forming the metal thin-film in an oxygen-free ambient in the foregoing step (D) for forming the metal thin-film resistance, continuously on the metal thin-film also in the oxygen-free ambient; and further by patterning the foregoing metal nitride film and the metal thin-film.

Thereby, the foregoing formation of the metal nitride film may be conducted by a sputtering process while using a nitrogen partial pressure of 18-90% for the sputtering gas.

According to a second aspect of the present invention, the fabrication process of a semiconductor device includes the steps (A)-(D) of:

(A) forming first and second contact holes in an insulation film;

(B) forming a first conductive plug in the first contact hole and a second conductive plug in the second contact hole by filling the first and second contact holes with a conductive material;

(C) forming a metal thin-film on the insulation film including a region thereof where the first conductive plug is formed for the metal thin-film resistance and further forming a protective film, and patterning the protective insulation film and the metal thin-film to form a metal thin-film resistance on the insulation film and on the first conductive plug in the form of a laminated pattern of the metal thin-film resistance and the protective insulation pattern; and (D) forming a metal film for metal interconnection pattern on the insulation film so as to include at least a region thereof in which the second conductive plug is formed and patterning the metal film to form a metal interconnection pattern on the second conductive plug and the insulation film.

According to the second aspect of the present invention, it is possible to apply an Ar sputter etching process to the insulation film in the step (C) for forming the metal thin-film resistance before formation of the metal thin-film at least in the part of the insulation film where the metal thin-film resistance is to be formed.

Thereby, it is possible to carry out the Ar sputter etching process with a depth of 25 Angstroms or more in terms of the etching depth of a thermal oxide film.

Thereby, in the foregoing step (C) of forming the metal thin-film resistance, it is also possible to form, after the formation of the metal thin-film in an oxygen-free ambient, a metal nitride film on the metal thin-film thus formed continuously also in the ambient free from oxygen and form a protective insulation film further thereon. Further, the protective insulation film, the metal nitride film and the metal thin-film are patterned to form a laminated structure of the metal thin-film resistance, the metal nitride pattern and the protective insulation film pattern.

Thereby, it is possible to form the metal nitride film by a sputtering process while setting the nitrogen partial pressure of the sputtering gas to 18-90%.

Further, it is also possible to form the metal nitride film as the protective insulation film.

According to the semiconductor device of the present invention in which there are provided first and second contact holes formed in an insulation film, a first conductive plug formed in the first contact hole, a second conductive plug formed in the second contact hole simultaneously to the formation of the first conductive plug, a metal thin-film resistance formed on the first conductive plug and the insulation film, and a metal interconnection pattern formed on the second conductive plug and the insulation film, there is no need of carrying out a patterning process by a wet etching process after formation of the metal thin-film resistance. Further, because there occurs no exposure of the interface between the metal thin-film resistance and the first conductive plug to the air, it becomes possible to achieve stabilized electrical connection between the metal thin-film resistance and the first conductive plug even in the case the oxide removal process is not applied to the metal thin-film resistance or formation of the barrier film for preventing etching is not conducted.

Thus, with the present invention, it becomes possible to achieve miniaturization of the metal thin-film resistance and stabilization of the resistance value thereof irrespective of the thickness of the metal thin-film resistance without increasing the number of process steps.

Further, with the present invention in which the metal thin-film resistance is formed on the first conductive plug in the first contact hole and on the insulation film, there arises no such problems explained with reference to FIG. 26, in which the metal thin-film resistance and the interconnection pattern are connected electrically via a contact hole formed on the interconnection pattern, such as increase of resistance variation and increase of contact resistance to the electrode caused by deterioration of step coverage of the metal thin-film resistance.

Further, because the second conductive plug used for connecting the upper and lower interconnection patterns electrically is formed simultaneously to the first conductive plug used for connecting to the metal thin-film resistance, there is no need of providing a dedicated process for forming the second conductive plug 119 explained with reference to FIG. 25 in addition to the process of formation of the interlayer insulate film 115 and the second contact hole 117, and it becomes possible to form a metal thin-film resistance with low cost and with short processing time, without increasing the number of the process steps.

Thus, with the present invention, it becomes possible to realize stable resistance value for the metal thin-film resistance, without inviting significant increase of the number of process steps.

Further, according to the semiconductor device of the present invention in which the first and second conductive plugs are formed of the first and second conductive materials, the top end of the first conductive material being formed with separation from the top edge of a first contact hole and from the top surface of the second conductive material, the outer periphery of the second conductive material and the top edge of the first contact hole having a tapered shape, the space on the first conductive member between the inner wall of the first contact hole and the second conductive material being filled with the buried material containing at least the material of the insulation film, the first conductive material and Ar, it becomes possible to form the tapered shape and the buried material by conducting an Ar sputter etching process to the insulation film in the state in which the top part of the first conductive material constituting the first conductive plug is removed and depression is formed around the first conductive plug. Because the outer periphery at the top surface of the second conductive material and the top edge of the first contact hole are formed to have a tapered shape and because the buried material is formed in the space on the first conductive material between the inner wall of the first contact hole and the second conductive material, it is possible with the present invention to improve the step coverage, and it becomes possible to stabilize the resistance value of the metal thin-film resistance and improve the precision of the resistance value.

Further, while there has been a problem that a conventional metal thin-film resistance is apt to be affected by the underlying film and thus undergoes variation of resistance value in response to the composition of the underlying film or depending on the duration elapsed from the moment the underlying film has been formed, it becomes possible to reduce the dependence of the sheet resistance value of the metal thin-film resistance on the underlying film and on the elapse of the time, by applying an Ar sputter etching process to the foregoing insulation film, which becomes the underlying film of the metal thin-film resistance. Thereby, it becomes possible to stabilize the resistance value of the metal thin-film resistance. The effect achieved by applying the Ar sputter etching process to the underlying film of the metal thin-film resistance will be explained later in detail.

Further, by providing the metal nitride film so as to cover the top surface of the metal thin-film resistance, there is formed no metal oxide film between the top surface of the metal thin-film resistance and the metal nitride film, and the problem of oxidation of the top surface of the metal thin-film resistance is eliminated. Thereby, it becomes possible to stabilize the resistance value of the metal thin-film resistance and improve the precision of the resistance value.

Further, by providing a protective film further on the foregoing metal thin-film resistance according to the process of the second aspect of the present invention, the need of conducting a patterning process after the metal thin-film resistance is formed by using a wet etching process, and there arises no problem that the contact surface of the metal thin-film resistance with the first conductive plug is exposed to the air. Thereby, it becomes possible to obtain excellent electrical connection between the metal thin-film resistance and the first conductive plug without conducting a surface oxide film removal process to the metal thin-film resistance and forming a barrier film for preventing etching. Thereby, it becomes possible to realize miniaturization of the metal thin-film resistance and stabilization of the resistance value irrespective of the thickness of the metal thin-film resistance, without increasing the number of the process steps.

Further, with the semiconductor device of the present invention, the metal thin-film resistance is formed on the first conductive plug formed in the first contact hole and further on the insulation film, and thus, there arises no problem of poor step coverage and associated problem of variation of the resistance value and increase of electrode contact resistance, contrary to the conventional fabrication process explained with reference to FIG. 26.

Further, because the second conductive plug used for connecting the upper and lower interconnection patterns is formed simultaneously to the first conductive plug, which is used for electrical connection to the metal thin-film resistance, there occurs no increase in the number of the fabrication steps as compared with the conventional fabrication process of FIG. 25, and it becomes possible to form the metal thin-film resistance with low cost and in short time.

Thus, with the semiconductor device of the present invention, it becomes possible to realize stable resistance value for the metal thin-film resistance without inviting significant increase in the fabrication process steps.

Further, in the present invention, it becomes possible to eliminate oxidation occurring in the top surface of the metal thin-film resistance by forming a metal nitride film between the metal thin-film resistance and the protective insulation film such that there is formed no metal oxide film between the top surface of the metal thin-film resistance and the metal nitride film. Thereby, it becomes possible to stabilize the resistance value of the metal thin-film resistance and improve the precision of the resistance value.

Further, in the present invention, it becomes possible to eliminate the oxidation of the top surface of the metal thin-film resistance without increasing the number of process steps, by forming a metal nitride film on the metal thin-film resistance as the protective film, such that there is formed no metal oxide film between the top surface of the metal thin-film resistance and the metal nitride film. Thereby, the resistance value of the metal thin-film resistance is stabilized and the precision thereof is improved.

With the semiconductor device of the present invention, it is further possible to improve the degree of freedom of design by forming the uppermost interconnection pattern as the metal interconnection pattern formed on the insulation film on which the metal thin-film resistance is formed. For example, it is possible to achieve layout modification of the metal thin-film resistance by way of layout modification of the metal thin-film resistance and further the uppermost interconnection pattern.

Further, by disposing the metal thin-film resistance on the insulation film on which the uppermost metal interconnection pattern is formed, there is formed a passivation film of an insulation material on the metal thin-film resistance, and it becomes possible, by reducing the thickness of the insulation material formed on the metal thin-film resistance, to reduce the thickness variation thereof as compared with the case in which there is formed an insulation film other than the passivation film is formed on the metal thin-film resistance. Thereby, variation of laser interference caused in the insulation material on the metal thin-film resistance is reduced at the time of trimming processing of the metal thin-film resistance conducted by irradiating a laser beam upon the metal thin-film resistance, and the variation of laser energy provided to the metal thin-film resistance is suppressed. Thereby, precision of trimming is improved. Further, it becomes possible to improve the performance of heat radiation of the metal thin-film resistance at the time of temperature rise associated with the laser irradiation for the trimming processing.

Further, according to the present invention, it becomes possible, with the semiconductor device having the voltage divider including two or more resistance elements formed of the metal thin-film resistance of the present invention for obtaining a voltage output by dividing out an input voltage and adjusting the output voltage by disconnecting a fuse element therein, to miniaturize the resistance element and stabilize the resistance value of the voltage divider by using the metal thin-film resistance of the present invention for the resistance element of the voltage divider. Thereby, the area for the voltage divider is reduced and the precision of output voltage is improved.

Further, with the semiconductor device of the present invention that includes the voltage divider for dividing an input voltage and supplying a divided-out output voltage, the reference voltage generator for supplying a reference voltage, and a voltage detection circuit having a comparator circuit for comparing the divided-out voltage from the voltage divider and the reference voltage from the reference voltage generator, the voltage divider is formed of the resistance elements, which in turn is formed of the metal thin-film resistance of the present invention, and thus, it becomes possible to reduce the area of the voltage divider and improve the precision of the output voltage of the voltage divider. Thereby, it becomes possible to reduce the area of the voltage detector and improve the precision of voltage detection.

Further, with the semiconductor device of the present invention that includes the output driver for producing a controlled output of an input voltage, the voltage divider for dividing out the output voltage and producing a divided-out voltage, the reference voltage generator for producing a reference voltage, and the constant-voltage generator having the comparator for comparing the divided-out voltage from the voltage divider and the reference voltage from the reference voltage generator and for controlling the operation of the output driver, the metal thin-film resistance of the present invention is used for the resistance elements of the voltage divider, and it becomes possible to reduce the area of the voltage divider and improve the precision of the output voltage. Thereby, it becomes possible to reduce the area of the constant voltage generator and stabilize the output voltage.

Further, with the fabrication process of the semiconductor device of the present invention that includes the steps of: (A) forming the first and second contact holes in the insulation film; (B) forming the first conductive plug in the first contact hole and the second conductive plug in the second contact hole; (C) forming the metal interconnection pattern on the second conductive plug and the insulation film; and (C) forming the metal thin-film resistance on the first conductive plug and on the insulation film, it becomes possible to eliminate the patterning process conducted by an wet etching process after the formation of the metal thin-film resistance. With the fabrication process of the present invention, the contact surface of the metal thin-film resistance with the first conductive plug is not exposed to the air, and thus, it becomes possible to achieve stable and excellent electrical connection between the metal thin-film resistance and the first conductive plug without carrying out the step of surface oxide removal and formation of the etching-resistant barrier layer. With this, it becomes possible to stabilize the miniaturization and stabilization of the resistance value of the metal thin-film resistance irrespective of the thickness of the metal thin-film resistance and without increasing the number of fabrication steps.

Particularly, by forming the metal thin-film resistance on the first conductive plug formed inside the first contact hole and on the insulation film in the step (D) for forming the metal thin-film resistance, there arises no problem of poor step coverage of the metal thin-film resistance, contrary to the case explained with reference to FIG. 26, in which electrical connection is achieved between the metal thin-film resistance and the first conductive plug via a contact hole formed on the interconnection pattern. Thereby, there occurs no problem of increase of variation of resistance value, and the problem of increase of contact resistance to the electrode is successfully avoided.

Further, with the step (B) for forming the conductive plugs, the second conductive plug for electrically connecting the upper and lower interconnection patterns is formed simultaneously to the first conductive plug for achieving electrical connection to the metal thin-film resistance, and thus, it becomes possible to eliminate the dedicated steps such as the step of forming the interlayer insulation film 115 and the steps of forming the second contact hole 117 and the second conductive plug 119 in the process explained with reference to FIG. 25, and it becomes possible to form the metal thin-film resistance with low cost and with reduced time, without increasing the number of process steps.

Thus, with the fabrication process of the semiconductor device of the present invention, it becomes possible to stabilize the resistance value of the metal thin-film resistance including the contact resistance thereof to an electrode.

Further, by applying an Ar sputter etching process to the insulation film in the step (D) before formation of the metal thin-film, in other words, by applying the Ar sputter etching process before formation of the metal thin-film to the insulation film, which serves for the underlying layer of the metal thin-film resistance, the problem of the resistance value of the metal thin-film resistance undergoing the effect of the underlying layer is substantially reduced. Further, time dependence of the resistance value is also reduced. Thereby, the resistance value of the metal thin-film resistance is stabilized. The effect achieved by applying the Ar sputter etching process to the underlying film of the metal thin-film resistance will be explained later in detail.

Further, with the step (C) for forming the metal interconnection pattern, there is formed a depression also around the second conductive material because of the removal of the upper part of the first conductive material constituting the first contact hole at the time of the removal of the metal film, and thus, it becomes possible to form a buried material in such a depression by conducting the AR sputter etching process. At the same time, it is possible to form a tapered shape at the outer periphery around the top surface of the second conductive material and the top edge part of the first contact hole.

Further, by forming the metal nitride film on the metal thin-film, after forming the metal thin-film in the oxygen-free ambient, in continuation with the formation of the metal thin-film also in the oxygen-free ambient and further patterning the metal nitride film and the metal thin-film to form a laminated pattern in which a metal nitride film pattern is laminated on a metal thin-film pattern in the step (D) of forming the metal thin-film resistance, it becomes possible to eliminate the oxidation of the top surface of the metal thin-film resistance, and the resistance value of the metal thin-film resistance is improved. Further, the precision of the resistance value is improved.

With the fabrication process of the semiconductor device of the present invention that includes the steps of: (A) forming the first and second contact holes in the insulation film; (B) forming the first conductive plug in the first contact hole and the second conductive plug in the second contact hole; (C) forming the laminated pattern of the metal thin-film resistance pattern and the protective insulation pattern on the first conductive plug and on the insulation film; and (D) forming the metal interconnection pattern on the second conductive plug and on the insulation film, there is no need of conducting a patterning process by a wet etching process after formation of the metal thin-film resistance. Further, the contact surface of the metal thin-film resistance to the first conductive plug is not exposed to the air. Thus, it is possible to miniaturize the metal thin-film resistance and stabilize the resistance value thereof, irrespective of the thickness of the metal thin-film resistance and without increasing the number of the process steps.

Further, because the metal thin-film resistance is formed on the first conductive plug in the first contact hole and further on the insulation film in the step (C), there arises no problem of poor step coverage in contrast to the conventional fabrication process explained with reference to FIG. 26, and there arises no problem of variation of the resistance value of the metal thin-film resistance or increase of the contact resistance caused by the poor step coverage of the metal thin-film resistance.

Further, because the first conductive plug and the second conductive plug are formed simultaneously in the step (B), it becomes possible to form the metal thin-film resistance with low cost and short time period without increasing the number of the process steps as compared with the fabrication process explained with reference to FIG. 25.

Thus, with the fabrication process of the present invention, it becomes possible to stabilize the resistance value of the metal thin-film resistance, including the contact resistance to the electrode.

Further, by applying the Ar sputter etching process to the insulation film in the step (C) noted before, it is possible to reduce the dependence of the sheet resistance of the metal thin-film resistance upon the underlying film and further reduce the change of the resistance value with elapsed time. Thereby, the resistance value of the metal thin-film resistance is stabilized.

Further, by forming the metal nitride film in the oxygen-free ambient in continuation to the formation of the metal thin-film conducted in the oxygen-free ambient and further by forming the protective insulation film thereon and patterning the protective insulation film, the metal nitride film and the metal thin-film subsequently, it becomes possible to obtain the laminated pattern in which the metal thin-film pattern, the metal nitride film pattern and the protective insulation pattern are laminated. Thereby, oxidation of the top surface of the metal thin-film resistance is eliminated, and the resistance value of the metal thin-film resistance is stabilized. Further, the precision of the resistance value is also improved.

Further, by forming the metal nitride film as the foregoing protective insulation film, it becomes possible to suppress the increase of process steps as compared with the case of forming the metal nitride film separately to the protective insulation film. In such a case, too, it is possible to eliminate the oxidation of the upper surface of the metal thin-film resistance. Thereby, the resistance value of the metal thin-film resistance is stabilized and the precision of the resistance value is improved.

BRIEF DESCRIPTION OF THE DRAWINGS

FIGS. 1A-1C are diagrams showing the semiconductor device according to an embodiment of a first mode of the present invention, wherein FIG. 1A shows the construction of the semiconductor device in a cross-sectional view, FIG. 1B shows a first contact hole thereof with magnification, while FIG. 1C shows a second contact hole thereof with magnification;

FIGS. 2A-2F are diagrams showing the fabrication process according to an embodiment of a first aspect of the present invention;

FIGS. 8A-8C are diagrams showing the semiconductor device according to another embodiment of the first mode of the present invention, wherein FIG. 8A shows the construction of the semiconductor device in a cross-sectional view, FIG. 8B shows the first contact hole thereof with magnification while FIG. 8C shows the second contact hole thereof with magnification;

FIGS. 9A-9C are diagrams showing the semiconductor device according to further embodiment of the first mode of the present invention, wherein FIG. 9A shows the construction of the semiconductor device in a cross-sectional view, FIG. 9B shows the first contact hole thereof with magnification while FIG. 9C shows the second contact hole thereof with magnification;

FIGS. 11A-11C are diagrams showing the semiconductor device according to an embodiment of a second mode of the present invention, wherein FIG. 11A shows the construction of the semiconductor device in a cross-sectional view, FIG. 11B shows a first contact hole thereof with magnification, while FIG. 11C shows a second contact hole thereof with magnification;

FIGS. 13A-13C are diagrams showing the semiconductor device according to another embodiment of the second mode of the present invention, wherein FIG. 13A shows the construction of the semiconductor device in a cross-sectional view, FIG. 13B shows the first contact hole with magnification, while FIG. 13C shows the second contact hole with magnification;

FIGS. 14A-14C are diagrams showing the semiconductor device according to a further embodiment of the second mode of the present invention, wherein FIG. 14A shows the construction of the semiconductor device in a cross-sectional view, FIG. 14B shows the first contact hole in enlarged scale, while FIG. 14C shows the second contact hole with enlarged scale;

FIGS. 15A-15C are diagrams showing the semiconductor device according to a further embodiment of the first mode of the present invention, wherein FIG. 15A shows the construction of the semiconductor device in a cross-sectional view, FIG. 15B shows the first contact hole with magnification, while FIG. 15C shows the second contact hole with magnification;

FIGS. 16A-16C are diagrams showing the semiconductor device according to a further embodiment of the first mode, wherein FIG. 16A shows the semiconductor device in a cross-sectional view, FIG. 16B shows the first contact hole with magnification, while FIG. 16C shows the second contact whole with magnification;

DETAILED DESCRIPTION OF THE INVENTION

Figure 1A:
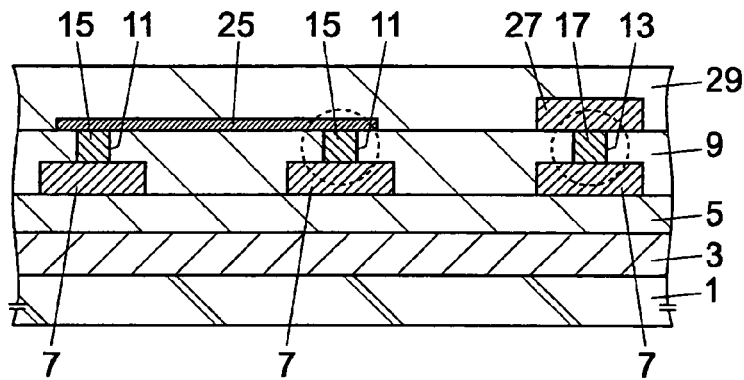
Figure 1B:
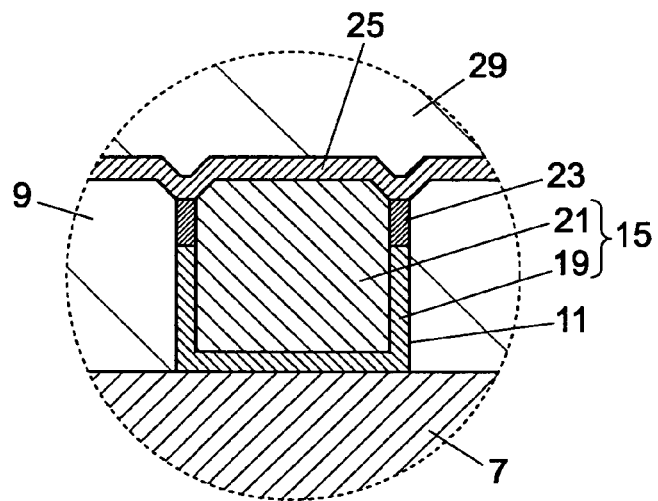
Figure 1C:
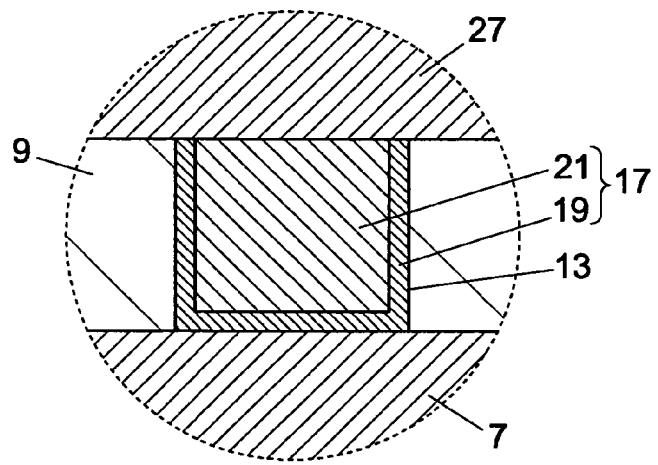

FIGS. 1A-1C are diagrams showing the semiconductor device according to an embodiment of a first mode of the present invention, wherein FIG. 1A shows the construction of the semiconductor device in a cross-sectional view, FIG. 1B shows a first contact hole thereof with magnification, while FIG. 1C shows a second contact hole thereof with magnification. In the embodiment described hereinafter, it should be noted that there are formed also transistors and capacitors not illustrated on the common substrate.

Referring to the drawings, there is formed a device isolation oxide film 3 on a silicon substrate 1, wherein the silicon substrate 1 is formed with a first interlayer insulation film 5 of BPSG or PSG (phoshosilicate glass) such that the first interlayer insulation film 5 covers the region where the device isolation oxide film 3 is formed.

On the first interlayer insulation film 5, there is formed a first-layer metal interconnection pattern 7, wherein the first-layer metal interconnection pattern 7 is formed for example of an AlSiCu film.

On the first interlayer insulation film 5, there is formed a second interlayer insulation film 9 so as to cover the region where the first interconnection pattern 7 is formed, wherein the second interlayer insulation film 9 is formed of lamination of a plasma CVD oxide film, an SOG film and a plasma CVD oxide film. In the illustration, the layer 9 is represented as a single monolithic layer.

In the second interlayer insulation film 9, there are formed a first contact hole 11 and a second contact hole 13 in correspondence to the first-layer metal interconnection pattern 7, wherein the first contact hole 11 is used for electrically connecting the first-layer metal interconnection pattern with a metal thin-film resistance to be formed on the second interlayer insulation film 9. On the other hand, the second contact hole 13 is used for connecting the first-layer metal interconnection pattern 7 with the second layer metal interconnection pattern to be formed on the second interlayer insulation film 9.

The first contact hole 11 is filled with a conductive material, and there is formed a first conductive plug 15 in the first contact hole 11. Similarly, the second contact hole 13 is filled with a conductive material, and there is formed a second conductive plug 17. Thereby, the first conductive plug 15 and the second conductive plug 17 are formed of a barrier metal 19 (first conductive material) of titanium, for example, formed on the inner surface of the contact hole, and tungsten plug 21 (second conductive material) formed on the barrier metal 19. In FIG. 1A, the barrier metal 19 and the tungsten plug 21 are formed collectively in each of the first conductive plug 15 and the second conductive plug 17.

As shown in FIG. 1B, it can be seen that, in the first contact hole 11, the top end of the barrier metal 19 is formed with separation from the top edge of the first contact hole 11 and further with separation form the top surface of the tungsten plug 21. Further, it should be noted that the outer peripheral part surrounding the top surface of the tungsten plug 21 and further the top edge part of the first contact hole 11 form a tapered surface, wherein illustration of this tapered surface is omitted in the representation of FIG. 1A.

Further, there is formed a buried material region 23 in the space formed on the barrier metal film 19 between the inner wall of the first contact hole 11 and the tungsten plug 21 by a material at least containing the material of the second interlayer insulation film 9, tungsten and Ar as the component thereof, wherein illustration of this buried material region 23 is also omitted in the representation of FIG. 1A.

On the other hand, with the second contact hole 13, it should be noted that the top surface of the barrier metal film 19 and the top surface of he tungsten plug 21 are coincident with the top surface of the second interlayer insulation film 9, and there is formed no tapered surface or buried material region 23 contrary to the first contact hole 11.

Further, it should be noted that there is formed a CrSi thin-film resistance (metal thin-film resistance) 23 on the first conductive plug 15 and on the second interlayer insulation film 9, wherein both end parts of the CrSi thin-film resistance 25 are connected to the first-layer metal interconnection patterns 7 via respective first conductive plugs 15.

Further, on the second conductive plug 17 and on the second insulation film 9, it should be noted that is formed a second-layer metal interconnection pattern 27 as the uppermost metal interconnection pattern, wherein it should be toned that this second-layer metal interconnection pattern 27 is connected to the first-layer metal interconnection pattern 7b eclectically.

Further, on the second interlayer insulation film 9 including the region where the CrSi thin-film resistance 25 and the second-layer interconnection pattern 27 are formed, there is formed a passivation film 29, formed of a lower silicon oxide film and an upper silicon nitride film, as the final protective film.

FIGS. 2A-2F are cross-sectional diagrams explaining an embodiment of the fabrication process according to a first aspect of the present invention, wherein the process of FIGS. 2A-2F represents the process for fabricating the embodiment semiconductor device explained with reference to FIG. 1, wherein it should be noted that the cross-sectional diagrams circled at the right of FIGS. 2A-2F represent the state of the first contact hole for the respective process steps with magnification.

Hereinafter, the embodiment of FIGS. 2A-2F will be explained with reference to FIG. 1 and FIGS. 2A-2F.

(1) First, the first interlayer insulation film 5 of BPSG or PSG is formed on the silicon substrate 1 in the form of wafer, on which formation of the device isolation film 3 and transistors (not shown) is completed, with the thickness of about 8000 Angstroms, and the first-layer metal interconnection pattern 7 of AlSiCu alloy is formed on the first interlayer insulation film 5 with the thickness of about 5000 Angstroms. Further, the second interlayer insulation film 9 is formed on the first interlayer insulation film 5 including the region where the first-layer metal interconnection pattern 7 has been formed, by consecutively forming a plasma CVD oxide film having the thickness of about 6000 Angstroms, an SOG film and a plasma CVD oxide film having the film thickness of about 2000 Angstroms.

Next, by using a known photolithographic process and dry etching process, the first contact hole 11 and the second contact hole 13 are formed in the second interlayer insulation film 9 in correspondence to the predetermined region of the first-layer metal interconnection pattern 7.

Next, the barrier metal 11 of titanium, for example, is formed on the entire surface of the second interlayer insulation film including the inner wall surface of the first contact hole 11 and the second contact hole 13 with the thickness of 1000 Angstroms, and after formation of a tungsten film thereon with the thickness of 7500 Angstrom, an etch back process or CMP process is conducted for removing unnecessary tungsten film and the barrier metal 19. With this, the first conductive plug 15 of the barrier metal 19 and the tungsten plug 21 is formed in the first contact hole 11 and the second conductive plug 17 of the barrier metal 19 and the tungsten plug 21 is formed in the second contact hole 13.

(2), Next, in the step of FIG. 2B, an interconnection metal film 31 of AlSiCu alloy is formed on the first interlayer insulation film 5 by using a DC magnetron sputtering apparatus with the thickness of about 5000 Angstroms. Here, it is also possible to form a refractory metal film such as a TiN film on the interconnection metal film 31 in continuation to the formation of the interconnection metal film 31 while maintaining the vacuum state to form an anti-reflection coating.

(3) Next, in the step of FIG. 2C, a resist pattern 33 is formed on the interconnection metal film 31 by a photolithographic process to define the region where the second metal interconnection pattern is to be formed, and the second-layer metal interconnection pattern 27 is formed by pattering the interconnection metal film 31 while using the resist pattern 33 as a mask.

Here, it should be noted that the interconnection metal film 31 on the first conductive plug 15 is removed as a result of the foregoing dry etching process, while such a dry etching process also removes the top part of the barrier metal 19 constituting the first conductive plug 15, and as a result, there is formed a depression around the first conductive plug 15. Reference should be made to the enlarged view of FIG. 2C.

It should be noted that such a depression is formed in the case there is a large etching selectivity between the metal film 31 and the tungsten plug 21 (second conductive material) and that there is a small etching selectively between the metal film 31 and the barrier metal 19 (first conductive material).

Thus, it should be noted that formation of such a depression occurs not only in the case in which the material of the first conductive plug and the material of the metal film are used with this specific combination of the present embodiment but also in the case in which there exists a small etching selectivity for the first conductive material constituting the first conductive plug with respect to the metal film for the metal interconnection pattern and that there exists a large etching selectivity for the second conductive material constituting the first conductive plug with respect to the first conductive material.

(4) After removing the resist pattern 33, an Ar sputter etching is applied in the step of FIG. 2D to the surface of the second interlayer insulation film 9 including the region where the first conductive pug 15 is formed. In the present example, the Ar sputter etching process has been conducted by using an Ar sputter etching chamber of a multi-chamber sputtering apparatus under the vacuum condition of 8.5 mTorr in pressure under the D.C. bias of 1250V for 20 seconds while flowing an Ar gas with the flow rate of 20 SCCM. It should be noted that this etching condition is equivalent to the condition of etching a thermal oxide film formed at 1000° C. under wet ambient with the depth of about 50 Angstroms.

As a result of this Ar sputter etching process, there is formed a tapered shape in the first contact hole at the outer peripheral part surrounding the top surface of the tungsten plug 21 and further at the top edge part of the first contact hole 11, wherein it should be noted that the space formed on the barrier metal 19 between the inner wall of the first contact hole and the tungsten plug 21 is filled with the buried material 23, which contains at least the material of the second interlayer insulation film 9, tungsten and Ar as a component thereof, as shown in the enlarged view of FIG. 2D.

(5) After completion of the Ar sputter etching process, formation of a CrSi thin-film (metal thin-film) 35 for the metal thin-film resistance is formed without breaking the vacuum state.

More specifically, the semiconductor wafer is transported from the Ar sputter etching chamber to the sputtering chamber equipped with a CrSi target, and formation of the CrSi thin-film 35 is conducted on the entire surface of the second interlayer insulation film 9 including the region where the first conductive plug 15 is formed with the thickness of about 50 Angstroms under the pressure of 8.5 mTorr by setting the D.C. power to 0.7 kilowatt for the duration of 9 seconds while supplying an Ar gas with the flow rate of 85 SCCM. Thereby, a target having the Si/Cr ratio of 80/20 wt % is used for the CrSi target. Reference should be made to FIG. 2E.

Thus, by conducting the Ar sputter etching process to the second interlayer insulation film before formation of the CrSi thin-film 35 used for the metal thin-film resistance, and by trimming the first contact hole 11 such that there is formed a tapered surface at the outer periphery of the top surface of the tungsten plug 21 and further at the top edge part of the first contact hole 11, and further by filing the space formed on the barrier metal 19 between the inner wall of the first contact hole 11 and the tungsten plug 21 with the buried material 23, it becomes possible to improve the step coverage of the CrSi thin-film 35 in the vicinity of the first contact hole 11.

Further, by conducting the foregoing Ar sputter etching process, it becomes possible to improve the dependence of the CrSi thin film resistance, formed from the CrSi thin-film 35 in the later process, on the underlying film, as will be described later in detail.

(6) Next, in the step of FIG. 2F, there is formed a resist pattern 37 on the CrSi thin-film 35 so as to define the region where the metal thin-film resistance is to be formed. Further, by using an RIE (reactive ion etching) apparatus, the CrSi thin-film 35 is patterned while using the resist pattern 37 as a mask, and with this, the CrSi thin-film resistance 25 is obtained.

(7) Next, the resist pattern 37 is removed.

Here, it should be noted that, because the CrSi thin-film resistance 25 is already connected electrically to the first-layer metal interconnection pattern 7 via the conductive plug 15. Thus, there is no need of conducting a metal oxide removal process to the surface of the CrSi thin-film resistance 25 by using a hydrofluoric acid.

Thereafter, a plasma CVD process is conducted and there is formed a silicon oxide film and a silicon nitride film consecutively on the second interlayer insulation film 9 including the region where the CrSi thin-film resistance 25 is formed as a passivation film 29. With this, the semiconductor device of FIG. 1 is obtained.

According to the foregoing embodiment, in which the first-layer metal interconnection pattern 7 and the contact holes 11 and 13 are formed at first and the CrSi thin-film resistance 25 is formed after formation of the conductive plugs 15 and 17 respectively in the contact holes 11 and 13 such that the CrSi thin-film resistance 25 is in electrical connection with the first-layer metal interconnection pattern 7 via the first conductive plug 15, there is no longer the need of carrying out a wet etching patterning process after patterning the CrSi thin-film resistance 25.

Further, because the contact surface of the CrSi thin-film resistance 25 to the first conductive plug 15 is not exposed to the air, excellent and stable electrical connection can be achieved between the CrSi thin-film resistance 25 and the first conductive plug 15 without applying a surface oxide film removal processing and formation of an etching-resistance barrier film is made on the CrSi thin-film resistance 25.

With this, it is possible to achieve miniaturization of the CrSi thin-film resistance 25 and stabilization of the resistance value thereof, irrespective of the thickness of the CrSi thin-film resistance 25 and without increasing the number of the process steps.

Further, because the CrSi thin-film resistance 25 is formed on the first conductive plug 15 and the second interlayer insulation film 9, there arises no problem such as variation of the resistance value and increase of contact resistance to the electrode as explained with reference to FIG. 26, in which the metal thin-film resistance and the first conductive plug are electrically interconnected via a contact hole formed on the interconnection pattern.

Further, because the second conductive plug 17 for electrically connecting the first-layer metal interconnection pattern 7 and the second-layer metal interconnection pattern 27 is formed simultaneously to the first conductive plug 15, there is no such a dedicated process explained with reference to FIG. 25, in which there are provided a dedicated process of forming the interlayer insulation film 115 and a further dedicated process of forming the second contact hole 117 and the second conductive plug 119, and thus, it becomes possible to form the CrSi thin-film resistance 25 with low cost and with improved throughput.

Figure 3:
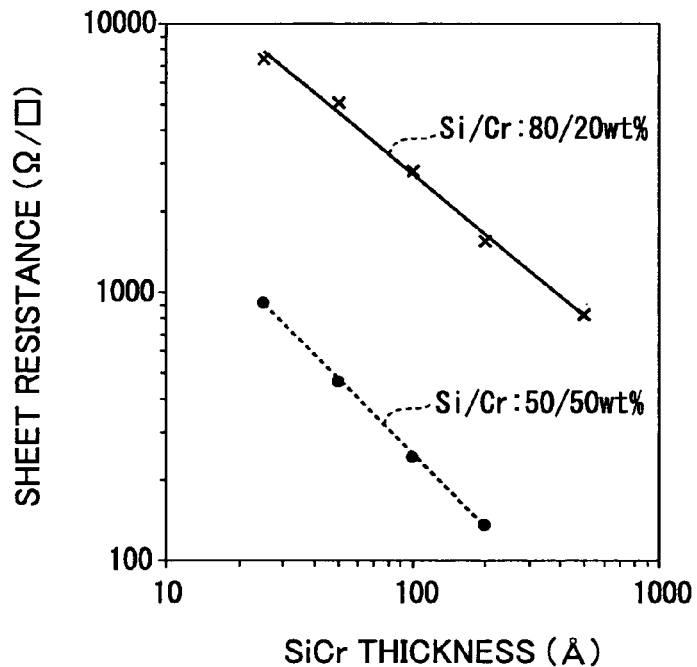
FIG. 3 is a diagram showing the relationship between a sheet resistance and film thickness of a metal thin-film resistance formed according to the present invention, wherein the vertical axis represents a sheet resistance ($\Omega/\square$) while the horizontal axis represents a CrSi film thickness in terms of Angstroms.
Figure 4:
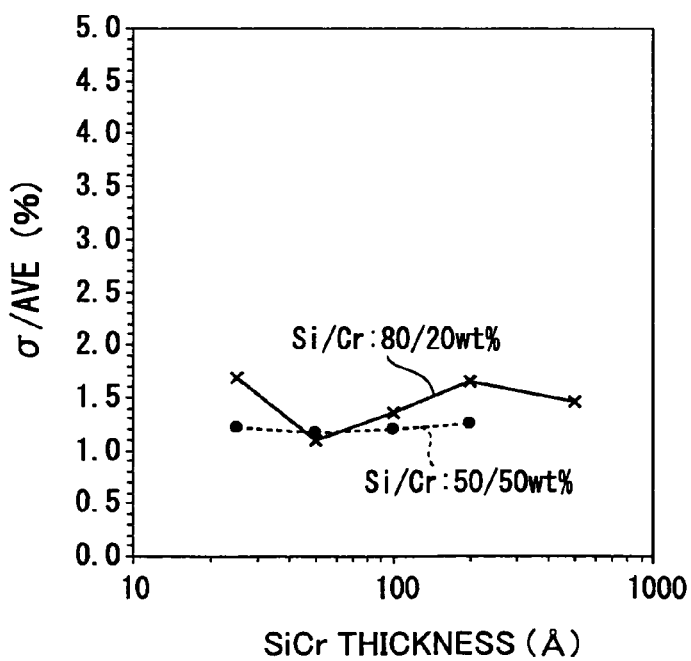
FIG. 4 is a diagram showing the variation of sheet resistance value of the metal thin-film resistance formed according to the present invention, wherein the vertical axis represents the quantity $\sigma$/AVE ($\sigma$ being the standard variation of the sheet resistance at 63 points on the wafer; AVE representing the average) while the horizontal axis represents the CrSi film thickness in terms of Angstroms.

FIGS. 3 and 4 show various properties of the metal thin-film resistance formed according to the process of the present embodiment, in which FIG. 3 shows the relationship between the sheet resistance of the metal thin-film resistance and the film thickness, wherein the vertical axis of FIG. 3 shows the sheet resistance ($\Omega/\square$), while the horizontal axis represents the thickness of the CrSi film represented in terms of Angstroms. Further, FIG. 4 shows the relationship between the standard deviation ($\sigma$) of the sheet resistance value of the metal thin-film resistance measured at sixty-three points on the wafer surface in the form divided by an average (AVE) thereof ($\sigma$/AVE) and the thickness of the CrSi film, wherein the vertical axis represents the quantity $\sigma$/AVE while the horizontal axis represents the film thickness of the CrSi film in terms of Angstroms.

In the experiment, the metal thin-film resistance has been formed by using a multi-chamber sputtering apparatus under the condition that the D.C. power is set to 0.7 kW while supplying an Ar gas with the flow rate of 85 SCCM at the pressure of 8.5 mTorr. Thereby, two targets, one having the Si/Cr ratio of 50/50 in terms of wt % and the other having the Si/Cr ratio of 80/20 in terms of wt % have been used and the deposition has been made with an adjusted duration such that the CrSi thin-film is formed with the thickness of 25-500 Angstroms. Thereby, it should be noted that there has been prepared no sample having the film thickness of 500 Angstroms for the case the foregoing target of the Si/Cr ratio of 50/50 is used for the sputter target.

On the other hand, the Ar sputter etching process before the formation of the CrSi thin-film has been conducted by using the same multi-chamber sputtering apparatus under the D.C. bias condition set to 1250V while supplying an Ar gas with the flow rate of 20 SCCM at the pressure of 8.5 mTorr for the duration of 160 seconds. This sputter etching condition corresponds to the etching processing for removing a thermal oxide film formed in a wet ambient at 1000° C. for the depth of 400 Angstroms.

Further, with the present sample, an AlSiCu film having the thickness of 5000 Angstroms has been used for the underlying metal interconnection pattern connected to the metal thin-film resistance, wherein a structure has been used in which there is formed no TiN film on the AlSiCu film at the bottom of the contact hole between the AlSiCu film and the CrSi thin-film.

The measurement of the sheet resistance has been made by using a two terminal method in which a voltage of 1V is applied to both ends of one metal thin-film resistance, which is one of twenty such metal thin-film resistances each having a width of 0.5 μm and a length of 500 μm and disposed with an interval of 0.5 μm, for measurement of the electric current.

Further, it should be noted that the contact hole connecting the metal interconnection pattern and the CrSi thin-film resistance has a size of 0.6 μm×0.6 μm in the plan view.

As shown in FIG. 3, it can be seen that linearity between the film thickness and the sheet resistance is maintained from the large film thickness of 200 Angstroms or more to extremely small film thickness of 25 Angstroms, in spite of the target composition (Si/Cr≧50/50 wt % and Si/Cr≧80/20 wt %) used for the sputter target. This means that it is possible to form an extremely miniaturized metal thin-film resistance by using a film thickness hitherto not possible.

Further, with reference to FIG. 4 showing the variation of sheet resistance value at the sixty three points on the wafer surface, it can be seen that there is little effect of film thickness on the variation of the resistance value in any of the cases of the target of the Si/Cr ratio of 5//50 wt % is used and the target of the Si/Cr ratio of wt % is used. In both of the cases, there is little variation of the resistance value. Thus with the use of the structure of the present invention, it becomes possible to form extremely miniaturized metal thin-film resistance pattern irrespective of the film thickness of the metal thin-film resistance.

Figure 5A:
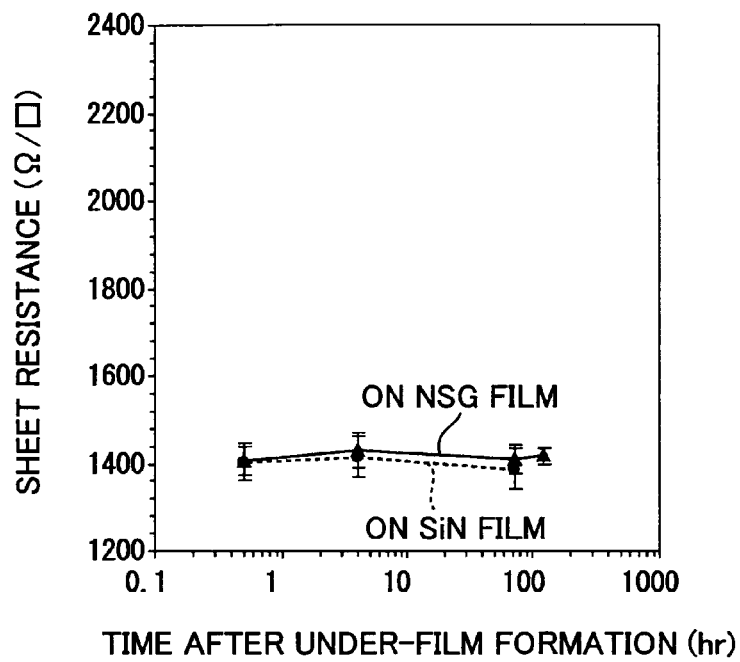
FIGS. 5A and 5B are diagrams showing the relationship between the sheet resistance value of the CrSi thin-film resistance and the time elapsed after formation of the underlying film of the metal thin-film resistance respectively for the case in which an Ar sputter etching process is applied before formation of the metal thin-film used for the metal-thin film resistance and for the case in which no such Ar sputter etching process has been made, wherein the vertical axis represents, in each of the drawings, the sheet resistance value ($\Omega/\square$) while the horizontal axis represents the time elapsed after formation of the underlying film in terms of seconds.
Figure 5B:
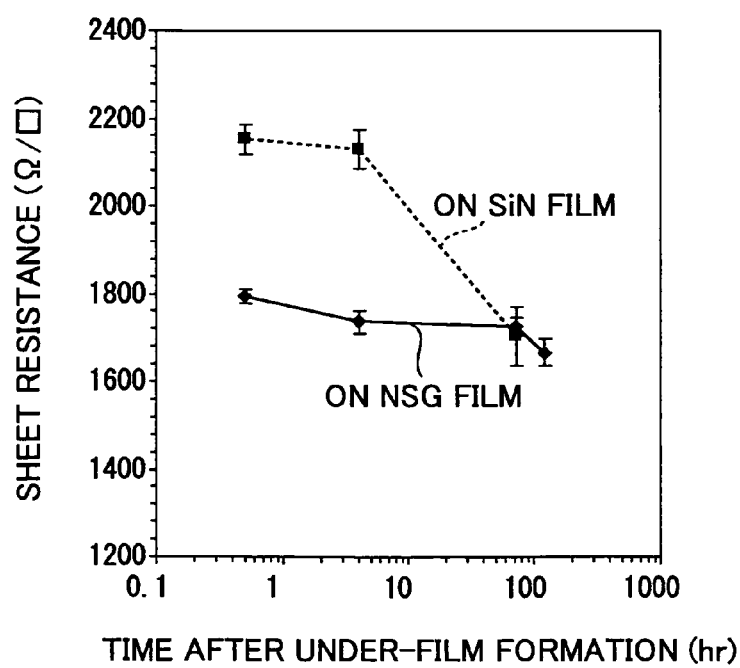

FIGS. 5A and 5B show the relationship between the sheet resistance value of the CrSi thin-film resistance and the elapsed time after formation of the underlying film of the metal thin-film resistance respectively for the case in which the Ar sputter etching process has been conducted before formation of the metal-thin film for the metal thin-film resistance and the case in which no such Ar sputter etching process has been conducted.

In the experiment of FIG. 5, there are prepared two silicon wafers, one having a plasma SiN film formed by a plasma CVD process with the thickness of 2000 Angstroms and the other having an NSG (non-doped silicate glass) film formed also by a plasma CVD process with the thickness of 2000 Angstroms, and the sheet resistance of the CrSi thin-film resistance has been measured for these two silicon wafers by way of four terminal method.

More specifically, the underlying plasma SiN film has been formed by using a parallel-plate plasma CVD apparatus at the temperature of 360° C. under the pressure of 5.5 Torr while setting the RF power to 200 W and supplying an $SiH_4$ gas, an $N_2$ gas and an $NH_3$ gas with respective flow rates of 70 SCCM, 350 SCCM and 40 SCCM.

On the other hand, the plasma NSG film has been formed by using the same parallel-plate plasma CVD apparatus at the temperature of 400° C. under the pressure set to 3.0 Torr while setting the RF power to 250 W and supplying an $SiH_4$ gas and an $N_2O$ gas with respective flow rates of 16 SCCM and 1000 SCCM.

Here, it should be noted that the CrSi thin-film resistance is formed by using the multi-chamber sputtering apparatus while using the target of the Si/Cr ratio of 80/20 wt % for the sputter target. More specifically, the CrSi thin-film resistance is formed to have a thickness of 100 Angstroms by setting the D.C. power to 0.7 kW under the pressure of 8.5 mTorr while supplying the Ar gas with the flow rate of 85 SCCM for the duration of 13 seconds.

Further, for those samples that has been subjected to the Ar sputter etching process, it should be noted that the sputter etching process has been conducted by using the same multi-chamber sputtering apparatus under the pressure of 8.5 mTorr while setting the D.C. bias to 1250V and supplying the Ar gas with the flow rate of 20 SCCM, wherein the Ar sputter etching process has been conducted for the duration of 80 seconds. It should be noted that this Ar sputter etching process corresponds to the etching of a thermal oxide film formed at 1000° C. in the wet ambient with a depth of 200 Angstroms.

As can be seen in FIG. 5B, there occurs a difference of sheet resistance in the CrSi thin-film depending on the material of the underlying film (SiN film and NSG film), in the case there has been conducted no Ar sputter etching process. Further, it can be seen that the sheet resistance is heavily affected by the time elapsed after the underlying film has been formed until the formation of the CrSi thin-film.

Contrary to this, as can be seen from

FIG. 5A, none of the material of the underlying film and the elapsed time provides substantial effect on the sheet resistance of the CrSi thin-film resistance in the case the Ar sputter etching process has been conducted.

From this, it can be seen that the variation of resistance value of the metal-thin film resistance, caused by the time elapsed after the previous process or caused by the difference of the materials forming the underlying film, can be improved significantly by conducting first an Ar sputter etching process and then conducting the formation of the metal thin-film for the metal thin-film resistance consecutively while maintaining the vacuum state.

Figure 6:
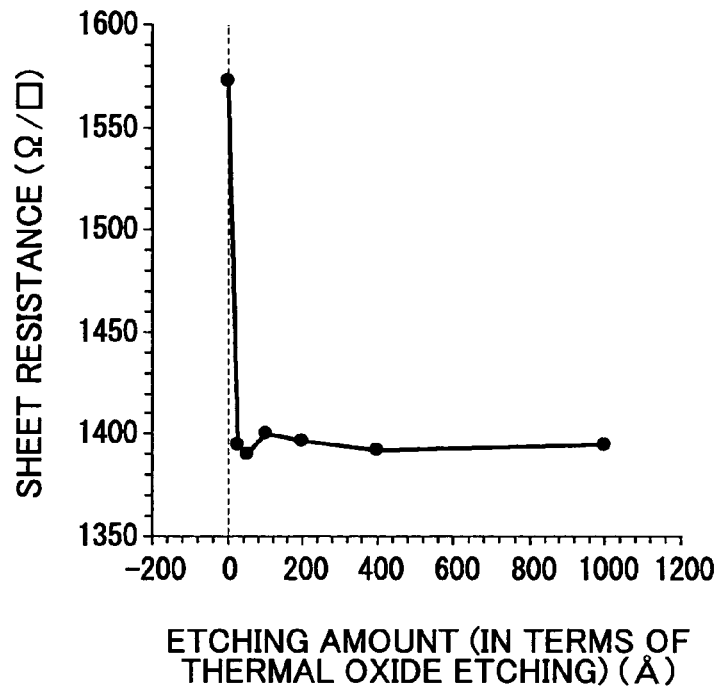
FIG. 6 is a diagram showing the relationship between the etching amount of the Ar sputter etching process and the sheet resistance, wherein the vertical axis represents the sheet resistance value ($\Omega/\square$) while the horizontal axis represents the etching amount represented in terms of Angstroms (equivalent etching amount of a thermal oxide film)

FIG. 6 is a diagram showing the relationship between the amount of the Ar sputter etching and the sheet resistance, wherein the vertical axis represents the sheet resistance in terms of $\Omega/\square$ while the horizontal axis represents the etching amount converted in terms of the etching amount of a thermal oxide film and represented by Angstroms. In the experiment of FIG. 6, a plasma NSG film and a CrSi thin-film resistance formed under the condition identical to the experiment of FIG. 5 have been used.

Further, there has been formed a CrSi thin-film resistance on a plasma NSG film after one week from the formation of the plasma NSG film by conducting the Ar sputter etching process. Here, the Ar sputter etching process has been conducted under the same condition identical to the case of FIG. 5 except for the etching amount.

More specifically, the etching amount has been adjusted such that there occurs an etching of 0 Angstroms (no Ar sputter etching), 25 Angstroms, 50 Angstroms, 100 Angstroms, 200 Angstroms, 400 Angstroms and 1000 Angstroms in terms of the etching amount of the thermal oxide film formed by the wet etching process. Measurement of the sheet resistance value of the CrSi thin-film resistance has been conducted by using four terminal method.

From the result of FIG. 6, it can be seen that stable resistance value for the CrSi thin-film resistance is achieved when the Ar sputter etching process has been conducted with the amount corresponding to 25 Angstroms ore more in terms of the etching amount of a thermal oxide film formed in a wet ambient.

In the experiment of FIG. 6, the sample corresponding to the maximum etching amount is etched with the amount of only 1000 Angstroms in terms of the thermal oxide film. However, it is expected that the same effect of the foregoing Ar sputter etching process is achieved also in the case in which the etching amount has exceeded 1000 Angstroms in terms of the etching amount of thermal oxide film, as long as there exists the underlying insulation film in the region where the metal thin-film resistance is to be formed.

Further, it was discovered that the Ar sputter etching process provides effect not only on the influence of the underlying layer but also on the stability of the resistance value of the CrSi thin-film.

Figure 7:
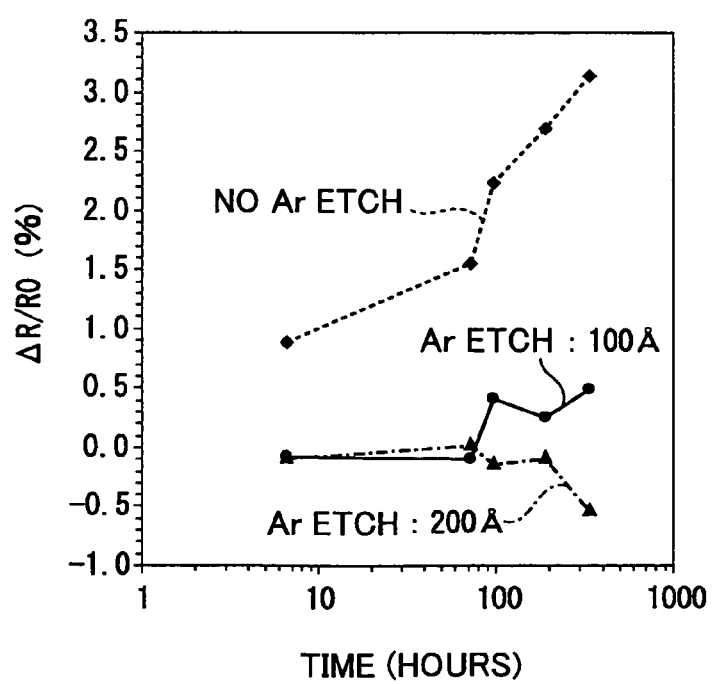
FIG. 7 is a diagram showing the relationship between the duration elapsed for the CrSi thin-film used for the metal thin-film resistance in the air at the temperature of 25° C. with the humidity of 45% and the change rate ($\Delta R/R0$) of the sheet resistance with regard to the sheet resistance immediately after the film formation, wherein the vertical axis represents the quantity $\Delta R/R0$ (%), while the horizontal axis represents the elapsed time (hours)

FIG. 7 shows the relationship between the duration in which a CrSi thin-film has been left in the air under the condition of 25° C. in temperature and 45% of humidity after formation of the CrSi film and the change rate (ΔR/R0) of the sheet resistance with regard to the sheet resistance R0 immediately after the film formation, wherein the vertical axis represents the quantity ΔR/R0 (%) while the horizontal axis represents the time in which the CrSi thin-film has been left in the air.

It should be noted that the result of

FIG. 7 is obtained for the sample in which the CrSi thin-film resistance is formed on the plasma NSG film formed under the condition identical with condition of FIG. 5.

With regard to the Ar sputter etching, three experiments were prepared: the one in which there is conducted no processing (no Ar etching); the one in which the etching is conducted for 40 seconds with the depth corresponding to 100 Angstroms of thermal oxide film (Ar etch: 100 A); and the one in which the etching is conducted for 80 seconds with the depth corresponding to 200 Angstroms (Ar eth: 200 A).

In the sample in where no Ar sputter etching has been conducted (no Ar etching), there occurs an increase of the resistance value with time from the moment of the film formation, and there appears a resistance change exceeding 3% after the sample is left in the air for 300 hours or more.

In the case the Ar sputter etching has been applied (Ar etch: 100 A; Ar etch: 200 A), on the other hand, the variation of the resistance value is decreased significantly, and it was confirmed that the deviation of the resistance value does not exceed ±1% with regard to the sheet resistance immediately after the film formation even in the case the sample is left in the air for 300 hours or more.

Particularly, it was discovered that there is little difference between the sample "Ar etch: 100 A" and the sample "Ar etch 200 A", indicating that the amount of etching provides little effect and that only a small etching amount is sufficient for suppressing the variation of the resistance value with time.

Heretofore, the effect of the present invention has been explained with reference to FIGS. 3-7 in relation to the effect of underlying film or the time left in which the CrSi thin-film resistance has been left in the air, on the sheet resistance, wherein it should be noted that these effects of the present invention is by no means limited to the CrSi thin film resistance formed by using the specific composition of Si/Cr=50/50 wt % or Si/Cr=80/20 wt % for the sputter target. It should be noted that similar effect noted above is observed also in the CrSi thin film formed by using the target having the composition of Si/Cr=50/50-Si/Cr=90/10 and in all of the CrSiN films. Further, the Ar sputter etching is not limited to the DC bias sputter etching process explained heretofore.

Further, with the fabrication process according to the embodiment noted above, it should be noted that the Ar sputter etching process conducted in the step (4) immediately before formation of the CrSi thin-film 35 may be omitted in the case there is formed no depression at the first contact hole 11 due to the removal of the barrier metal film 19 or in the case there is no effect on the resistance value of the CrSi thin-film resistance 25 even when no such a depression is formed.

Figure 8A:
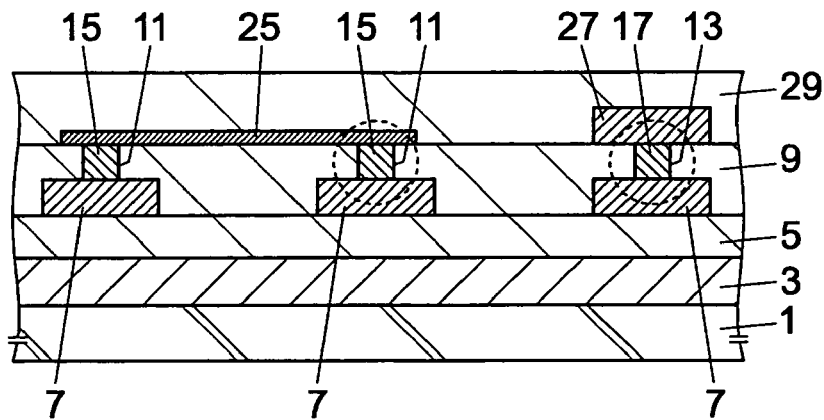
Figure 8B:
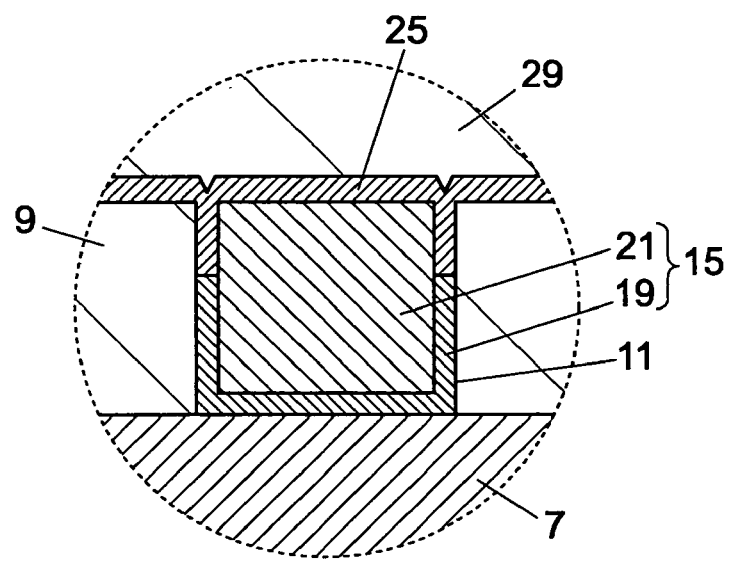
Figure 8C:
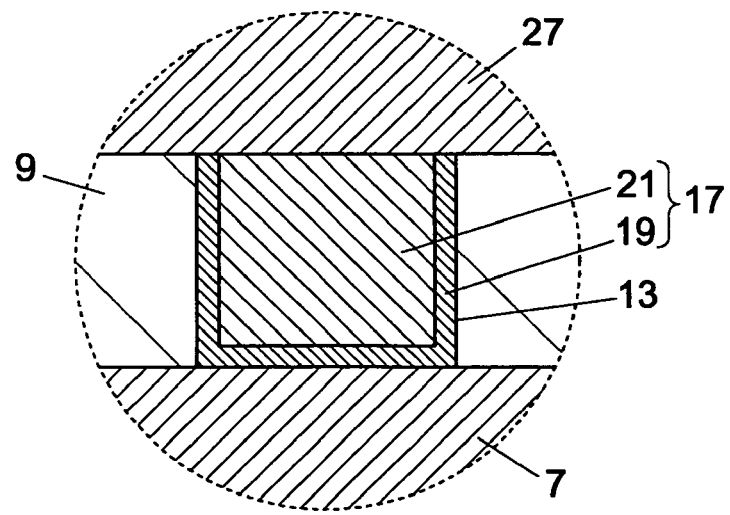

FIGS. 8A-8C shows a semiconductor device according to another embodiment of the first mode of the present invention. It should be noted that the semiconductor device of the present embodiment can be formed similarly to the embodiment explained with reference to FIGS. 2A-2F except for the foregoing step (4).

In the embodiment shown in FIGS. 8A-8C, in which there is conducted no Ar sputter etching process, there is formed no tattered part at the outer periphery of the tungsten plug 21 or at the top edge part of the first contact hole 11. Further, there is formed no buried material in the space on the barrier metal 19 between the inner wall of the first contact hole 11 and the tungsten plug 21.

Even in such an embodiment, the effect similar to those obtained in the embodiment explained with reference to FIGS. 1A-1C are obtained except for the effect achieved by the Ar sputter etching process.

In such an embodiment, too, it is preferable to apply the Ar sputter etching process in view of the fact that the resistance value of the CrSi thin-film resistance 25 is stabilized by conducting such an Ar sputter etching process immediately before formation of the CrSi thin film 35.

Although the foregoing embodiment uses a film planarized by formation of the SOG film and subsequent etch-back process for the second interlayer insulation film 9, it should be noted that the insulation film used for the underlying layer of the metal thin-film resistance is not limited to such a particular layer. For example, it is possible to use various insulation films such as an insulation film planarized by a CMP process, a plasma CVD oxide film not applied with a planarization process, a planarized SOG film formed by thermal reflowing process after a spin-coating process, a CVD insulation film formed by a HDP (high-density plasma)-CVD process, followed by an etch back process, and the like, for the insulation film serving for the underlying layer of the metal thin-film resistance.

In the case of analog devices, in particular, there frequently occur situations in which not only TCR but also the parity and comparative precision are also important. Thus, in the case of using the metal thin-film resistance of the present invention in an analog resistance element, it is preferable to apply a planarization processing to the insulation film used for the underlying film of the metal thin-film resistance.

Further, while the foregoing embodiment uses the second-layer metal interconnection pattern 27 as the uppermost metal interconnection pattern and thus forms the passivation film 29 on the CrSi thin-film resistance 25, the present invention is not limited to such a particular construction and it is also possible to form a further insulation film on the CrSi thin-film resistance 25 such as an interlayer insulation film carrying the third-layer metal interconnection pattern.

Figure 9A:
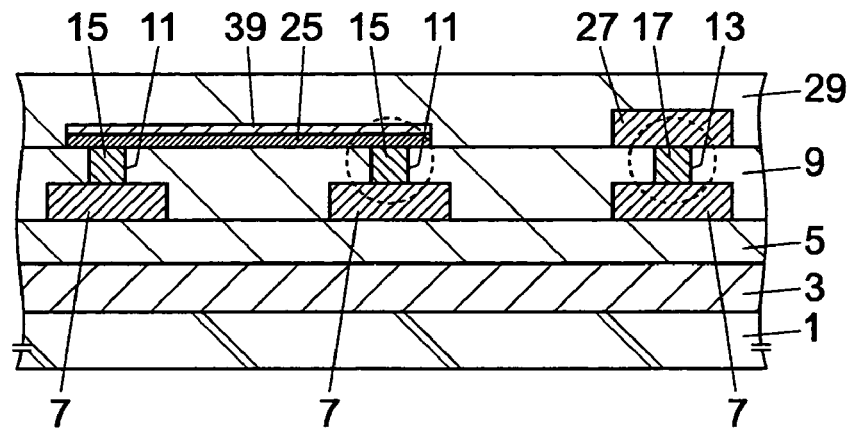
Figure 9B:
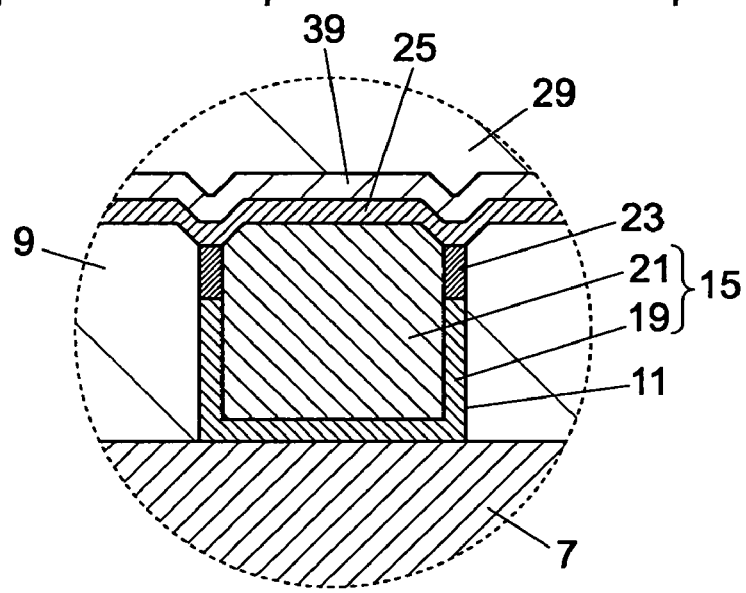
Figure 9C:
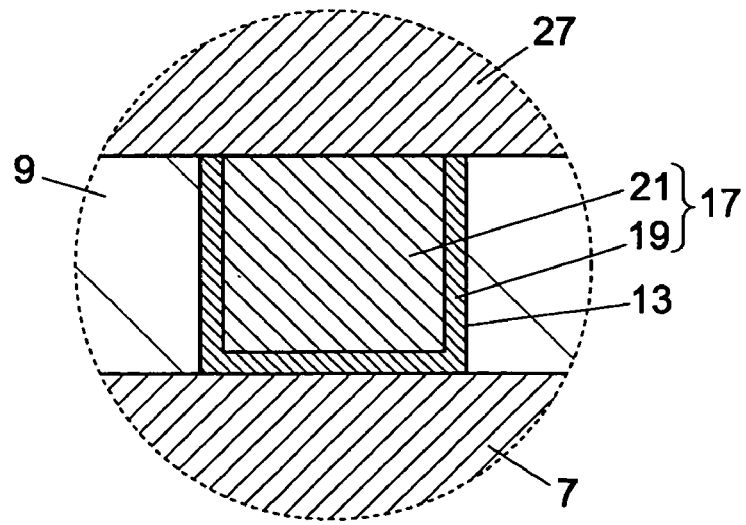

FIGS. 9A-9C are diagrams showing the construction of a semiconductor device according to further embodiment of the first mode of the present invention, wherein FIG. 9A shows the semiconductor device in a cross-sectional view while FIGS. 9B and 9C respectively show the first contact hole and the second contact hole with magnification.

It should be noted that the device of the present embodiment is distinct over the embodiment explained with reference to Figure e1 in the point that there is formed a CrSiN film (metal nitride film) pattern on the top surface of the CrSi thin-film resistance 25. Thereby, it should be noted that there is formed no oxide CrSiO between the CrSi thin-film resistance 25 and the SiN film pattern 39.

Hereinafter the method of forming the CrSiN film pattern 39 on the top surface of the CrSi thin-film resistance 25 will be explained with reference to FIGS. 9A-9C.

Thus, according to the steps (1)-(5) explained with reference to FIGS. 2A-2E, there is formed a structure on the silicon substrate 1 still in the form of silicon wafer, on which the formation of the device isolation oxide film 3 has been completed, such that the structure includes the first interlayer insulation film 5, the first-layer metal interconnection pattern 7, the second interlayer insulation film 9, the contact holes 11 and 13, the conductive plugs 15 and 17, the second-layer metal interconnection pattern 27, the buried material 23 and a CrSi thin film.

After formation of the CrSi thin film, there is formed a CrSiN film on the CrSi thin-film without breaking the vacuum, wherein the formation of the CrSiN film is conducted by using the CrSi target of the Si/Cr ratio of 80/20 wet % used for the CrSi thin film.

More specifically, the CrSiN film is formed under the pressure of 8.5 mTorr by setting the D.C. power to 0.7 kW while supplying a mixture of Ar and $N_2$ with the flow rate of 85 SCCM for the duration of 6 seconds. With this, the CrSiN film is formed on the CrSi thin-film with the thickness of about 50 Angstroms.

Next, the CrSiN film and the CrSi thin-film are patterned by a photolithographic process and dry etching process similarly to the step (6) explained with reference to FIG. 2F, and there is formed a laminated pattern of the CrSiN film pattern 39 and the CrSi thin-film resistance 25.

Thereafter, formation of the passivation film 29 is conducted on the second interlayer insulation film 9 including the formation region of the CrSi thin-film resistance 25 and the CrSiN film pattern 39.

Generally, a metal film shows strong reactivity with oxygen and it is known that there occurs change of resistance value when such a metal thin-film is left in the air over a prolonged time in the state that the metal thin-film is exposed to the air.

On the other hand, the present embodiment successfully eliminates variation of the resistance value of the CrSi thin film, caused by the exposure of the top surface of the CrSi thin-film resistance 25 to the air, by forming the CrSiN film pattern 39 on the top surface of the CrSi thin-film resistance 25.

Here, it should be noted that the electrical connection between the CrSi thin-film 35 and the first-layer metal interconnection pattern 7 has already been achieved at the time the CrSi thin-film 35 is formed for formation of the CrSi thin-film resistance 25, and thus, the electrical properties of the CrSi thin-film resistance 25 experience no change even when a new film of CrSiN is formed on the CrSi thin-film 35.

Figure 10:
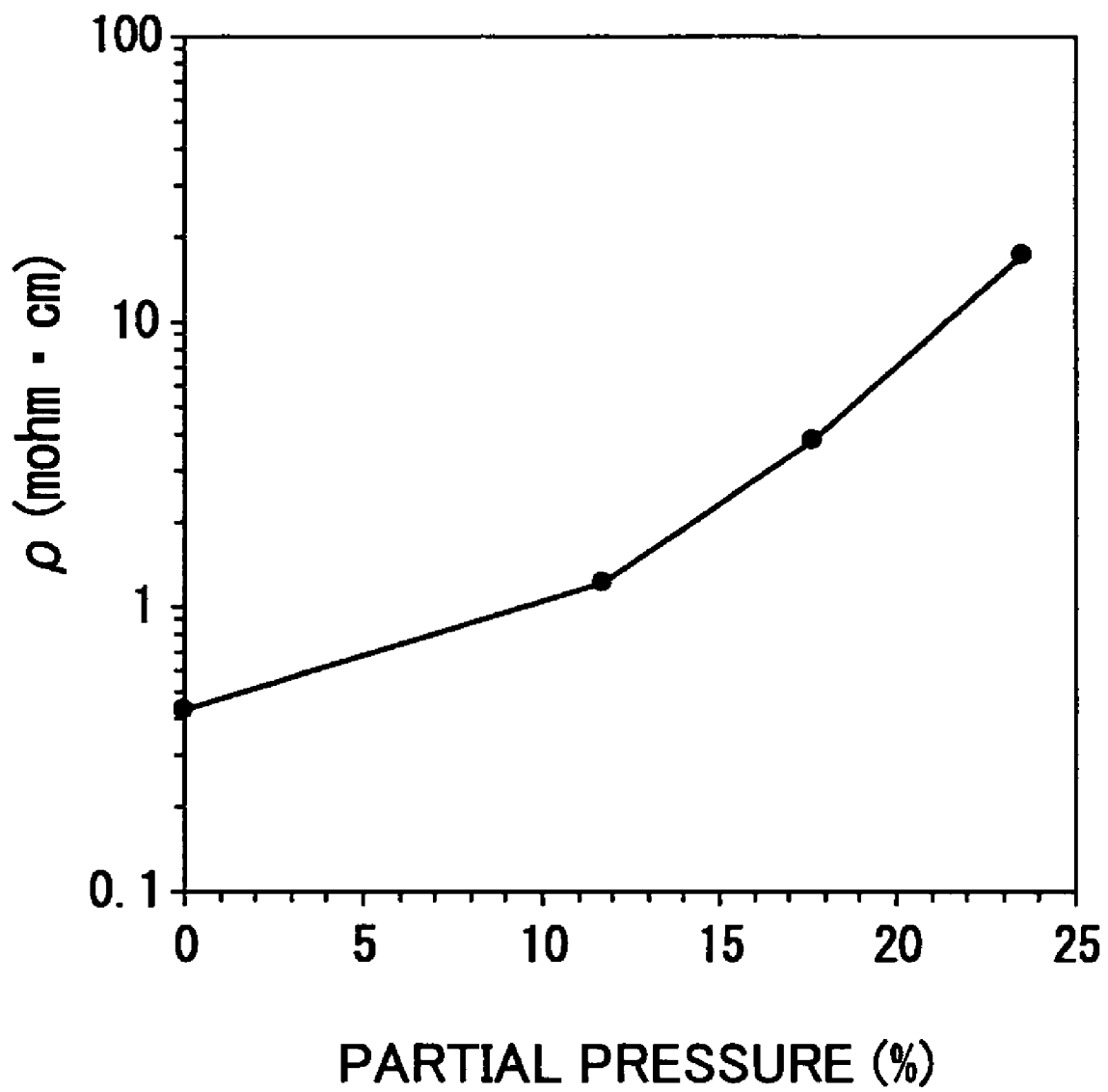
FIG. 10 is a diagram showing the relationship between the N1 partial pressure in the gas used for forming the CrSiN film and the resistivity of the CrSiN film, wherein the vertical axis represents the resistivity $\rho$ (mohm·cm) while the horizontal axis represents the N2 partial pressure (%)

FIG. 10 shows the relationship between the $N_2$ partial pressure of the gas for the formation of the CrSiN film and the resistivity of the CrSiN film, wherein the vertical axis represents the resistivity ρ (mohm·cm) while the horizontal axis represents the $N_2$ partial pressure (%). In the present experiment, the CrSiN film has been formed by using the target of Si/Cr=50/50 wt % under the pressure of 8.5 mTorr while setting the D.C. power to 0.7 kW and supplying the mixed gas of Ar and $N_2$ with the flow rate of 85 SCCM for the duration of 6 seconds.

As can be seen in FIG. 10, the CrSiN film formed by the reactive sputtering process in the ambient added with $N_2$ with the partial pressure of 18% or more shows a very large resistivity of ten times or more as compared with the case in which no addition of $N_2$ has been made ($N_2$ partial pressure 0%).

Thus, by forming the CrSiN film by setting the $N_2$ partial pressure to be 18% or more, the CrSiN film does not provide effect on the resistance value of the CrSi thin-film even when the CrSiN film is formed directly on the CrSi thin-film resistance, and the overall resistance value of the CrSi thin-film resistance is determined by the CrSi thin-film.

Here, it should be noted that the $N_2$ partial pressure should not exceed 90%, in view of substantial decrease of the sputtering rate, which in turn resulting in poor throughput. Thus, the upper limit of the $N_2$ partial pressure should be about 90%.

On the other hand, in the case the $N_2$ partial pressure is controlled to the range of 6-11%, there occurs a reactive sputtering of a CrSiN film, which can be used also as a metal thin-film resistance.

In the illustrated example, the CrSiN film pattern 39 is formed on the CrSi thin-film resistance 25, while it is also possible to form a CVD insulation film such as a silicon nitride film on the CrSi thin-film resistance 25. However, a marketed multi-chamber sputtering apparatus generally does not have a CVD chamber, and use of such a CVD insulation film necessitates purchasing of new facility capable of forming a CVD insulation film in continuation with the CrSi thin-film resistance 25 without breaking the vacuum. Thereby, there arises a problem of increased cost.

As explained with reference to the foregoing embodiment in which the CrSiN film is formed on the CrSi thin-film 35 used for the CrSi thin-film resistance 25, it is possible to form the CrSiN film on the CrSi thin-film 35 as the oxidation-resistant cover film of the CrSi thin-film resistance 25 continuously without breaking the vacuum by using conventional multi-chamber sputtering apparatus without purchasing a new apparatus.

Figure 11A:
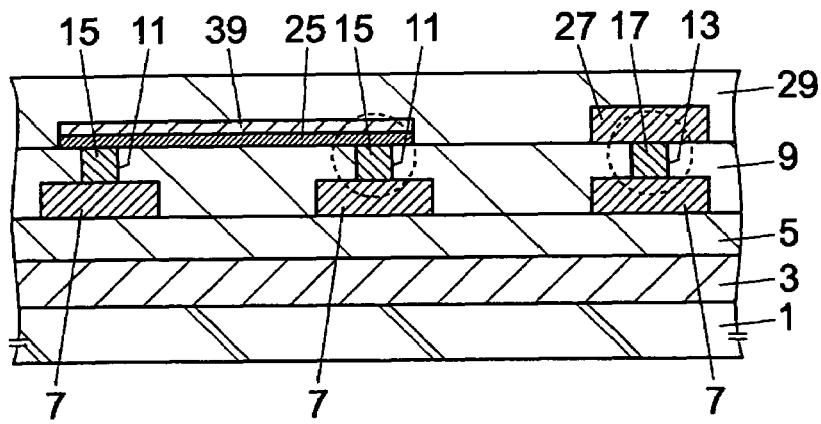
Figure 11B:
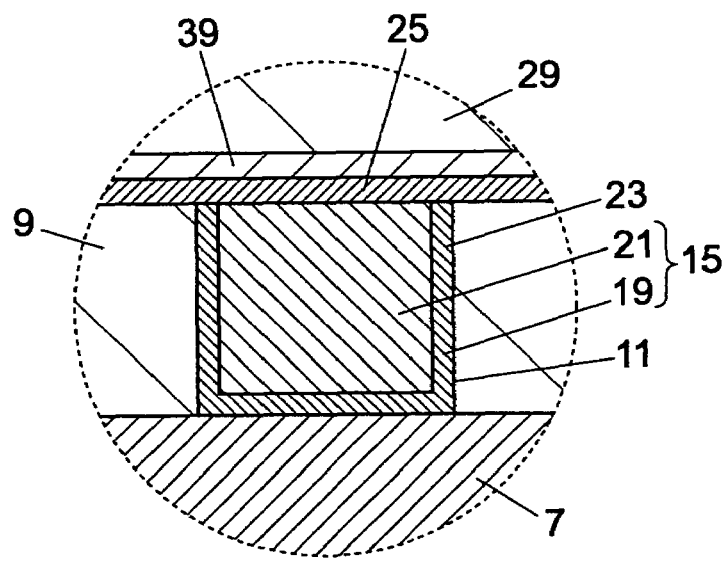
Figure 11C:
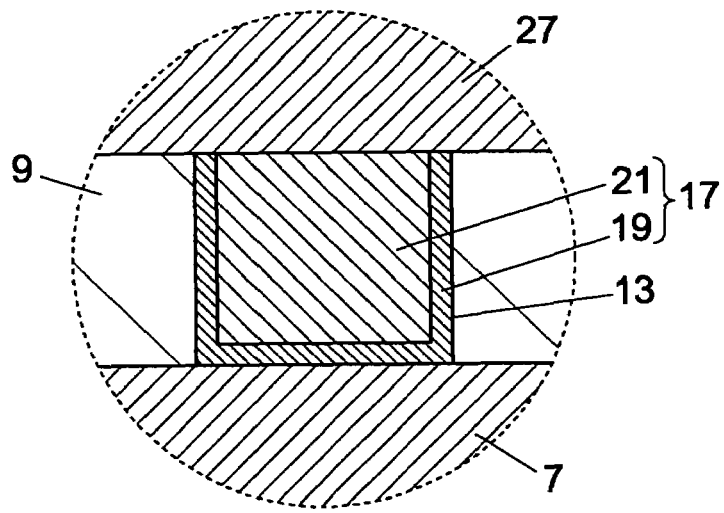

FIGS. 11A-11C are diagrams showing the construction of a semiconductor device according to an embodiment of a second mode of the present invention, wherein FIG. 11A shows the semiconductor device in a cross-sectional view, FIG. 11B shows the first contact hole with magnification and FIG. 11C shows the second contact hole with magnification. In the drawings, those parts corresponding to the parts described previously are designated by the same reference numerals and the description thereof will be omitted.

Referring to FIG. 11A, the semiconductor device includes the device isolation oxide film 3 on the silicon substrate 1, and the first interlayer insulation film 5, the first-layer metal interconnection pattern 7, the second interlayer insulation film 9, and the first and second contact holes 11 and 13 are formed. Further, the first contact hole 11 includes therein the first conductive plug 15 and the second contact hole 13 includes therein the second conductive plug 17. Further, each of the first conductive plug 15 and the second conductive plug 17 is formed of the barrier metal 19 and the tungsten plug 21. Thereby, it should be noted that FIG. 11A shows the barrier metal 19 and the tungsten 21 collectively as the first conductive plug 15 and the second conductive plug 17.

As shown in FIGS. 11B and 11C, it should be noted that the top surface of the barrier metal film 19 and the top surface of the tungsten plug 21 form a flush surface with the top surface of the second interlayer insulation film.

Further, the CrSi thin-film resistance 23 is formed on the second interlayer insulation film 9 so as to cover the first conductive plug 15, wherein it sill be noted that the CrSiN film pattern 39 is formed on the top surface of the CrSi thin-film resistance 25 as the protective insulation film. Further, it should be noted that there is formed no CrSiO between the CrSi thin-film oxide 25 and the CrSiN film pattern 39.

Further, on the second interlayer insulation film, the second-layer metal interconnection pattern 27 is formed so that the second-layer metal interconnection pattern 27 covers the second conductive plug 17. Thereby, the second-layer metal interconnection pattern 27 is connected electrically to the first-layer metal interconnection pattern 7 via the second conductive plug 17.

Further, the passivation film 29 is formed on the second interlayer insulation film 9 so as to cover the region where the CrSi thin film resistance 25 and the second-layer metal interconnection pattern 27 are formed.

FIGS. 12A-12E are cross-sectional diagrams for explaining an embodiment of the fabrication process according to a second aspect of the present invention, wherein each of FIGS. 12A-12E includes an enlarged cross-sectional view showing the state of the first contact hole circled at the right part thereof. Hereinafter, the present embodiment will be explained with reference to FIGS. 11 and 12.

Figure 12A:
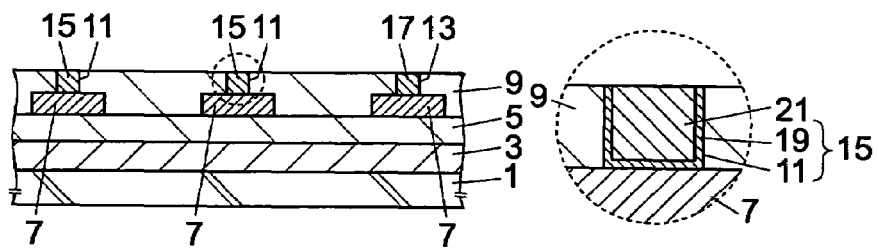
FIGS. 12A-12E are cross-sectional diagrams showing the fabrication process according to an embodiment of a second aspect of the present invention.

(1) Similarly to the step (1) explained with reference to FIG. 2A, the silicon substrate 1 is formed with the device isolation oxide film 3, and the first interlayer insulation film 5, the first-layer metal interconnection pattern 7, and the second interlayer insulation film 9 are formed consecutively. Further, the first and second contact holes 11 and 13 are formed in the second interlayer insulation film 9 and the first and second conductive plugs 15 and 17, each formed of the barrier metal 19 and the tungsten pug 21, are formed respectively in the first and second contact holes 11 and 13. Reference should be made to FIG. 12A.

(2) Next, an Ar sputter etching process is applied to the surface of the second interlayer insulation film 9 including the regions thereof in which the first conductive plug 15 and the second conductive plug 17 are formed, under the same processing condition as in the case of the AR sputter etching process of the step (4) explained with reference to FIG. 2D.

After the Ar sputter etching process, formation of a CrSi thin-film 35 for the metal-thin film resistance is conducted in continuation therewith with the thickness of about 50 Angstroms without breaking the vacuum under the condition identical with the condition explained in the step (5) with reference to FIG. 2E.

Figure 12B:
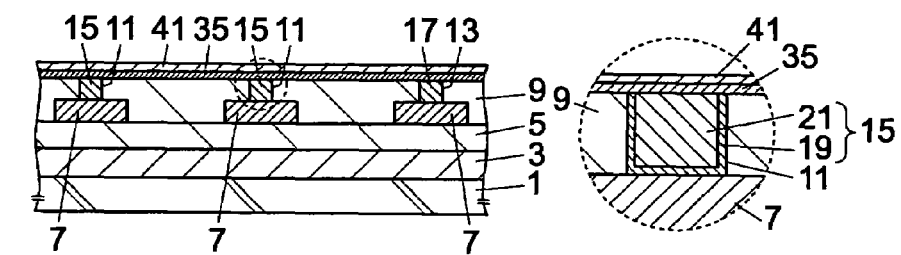

Further, after formation of the CrSi thin-film 35, a CrSiN film 41 is formed on the CrSi thin-film 35 in continuation with the formation process of the CrSi thin-film 35 without breaking the vacuum. In this process, the CrSi target of Si/Cr=80/20 wt % used with the formation process of the CrSi thin film is used, and the formation of the CrSiN film 41 is conducted under the pressure of 8.5 m Torr while setting the D.C. power to 0.7 kW and supplying a mixture of Ar and $N_2$ with the flow rate of 85 SCCM for the duration of 6 seconds. With this, the CrSiN film 41 is formed on the CrSi thin-film 35 with the thickness of about 50 Angstroms. Reference should be made to FIG. 12B. Here, it should be noted that the thickness of the CrSiN film 41 may be increased beyond the foregoing value of 50 Angstroms, so as to avoid etching of the CrSi thin-film resistance at the time of the patterning process of the second metal interconnection pattern to be decried later.

Figure 12C:
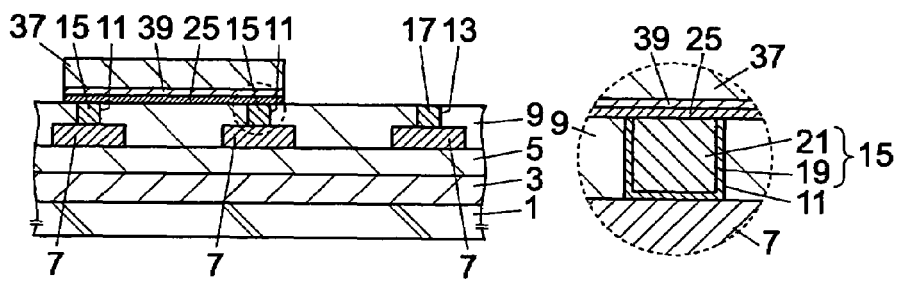

(3) Next, by using a photolithographic process, a resist pattern 37 is formed on the CrSiN film 41 for defining the region on which the metal thin-film resistance is to be formed. Further, the CrSiN film 41 and the CrSi thin-film 35 are patterned by using an RIE apparatus while using the resist pattern 37 as a mask, and there is formed a laminated pattern in which the lower layer is formed of the CrSi thin-film resistance 25 and the upper layer is formed of the CrSiN film pattern 39. Reference should be made to FIG. 12C.

Figure 12D:
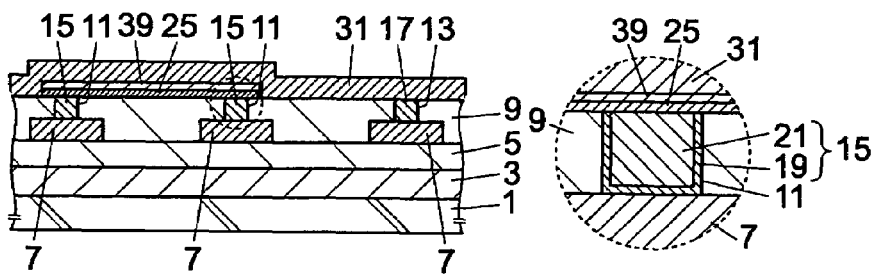

(4) Further, an interconnection metal film 31 of an AlSiCu alloy is formed on the first interlayer insulation film 5 so as to include the region of the laminated pattern of the CrSi thin-film resistance 25 and the CrSiN pattern 39 by using a D.C. magnetron sputtering apparatus with a thickness of about 5000 Angstroms. Here, it is possible to further form a refractory metal film such as a TiN film on the interconnection metal film 31 in continuation without breaking the vacuum as an anti-reflection coating. Reference should be made to FIG. 12D.

Figure 12E:
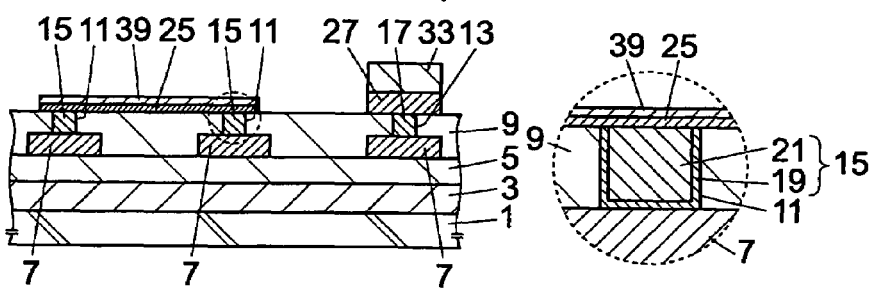

(5) Next, by using a photolithographic process, there is formed a resist pattern 33 on the interconnection metal film 31 so as to define the region where the second metal interconnection pattern is to be formed, and the interconnection metal film 31 is patterned by a dry etching process while using the resist pattern 33 as a mask. Thereby, there is formed a second-layer metal interconnection pattern 27. Reference should be made to FIG. 12E. Because the CrSi thin-film resistance 25 is covered with the CrSiN film 41, the CrSi thin-film resistance 25 is not subjected to the etching.

(6) Further, the resist pattern 33 is removed, and a silicon oxide film and a silicon nitride film are formed consecutively by a plasma CVD process, or the like, on the second interlayer insulation film 9 as a passivation film 29 such that the passivation film 29 covers the region where the CrSi thin-film resistance 25 is formed. With this, fabrication of the semiconductor device of FIGS. 11A-11C is completed.

According to the present embodiment of the semiconductor device of the second mode of the present invention and according to the present embodiment of the fabrication process of the second aspect of the present invention, the CrSi thin-film resistance 25 and the first-layer metal interconnection pattern 7 are connected electrically via the first conductive plug 15 similarly to the embodiment explained with reference to FIGS. 1 and 2, there is no need of conducting a patterning process by using a wet etching process after patterning the CrSi-thin-film resistance 25. Further, there occurs no situation in which the contact surface of the CrSi thin-film resistance 25 with the first conductive plug 15 is exposed to the air. Further, there arises no such a problem that a large variation of resistance value or increase of contact resistance to the electrode appears for the metal thin-film resistance due to the poor step coverage of the metal thin-film resistance as in the case explained with reference to FIG. 26 in which the electrical connection between the metal thin-film resistance and the first conducive plug is achieved via the contact hole formed on the interconnection pattern. Further, it is possible to eliminate the dedicated process steps of forming the interlayer insulation film 115, forming the second contact hole 117 and forming the second conductive plug 119 contrary to the fabrication process explained with reference to FIG. 25. Thus, with the present embodiment, it becomes possible to miniaturize the CrSi thin-film resistance 25 and stabilize the resistance value thereof irrespective of the thickness or the CrSi thin-film resistance 25 and without increasing the number of the fabrication process steps.

Further, because there is formed no steps or depressions in the region where the first contact hole 11 or first conductive plug 15 is to be formed, it becomes possible to form the CrSi thin-film resistance 25 on a flat surface, and the resistance value of the CrSi thin-film resistance 25 is substantially stabilized.

Further, as a result of the Ar sputter etching process conducted immediately before the formation of the CrSi thin film 35 for the CrSi thin-film resistance 25 as in the case of the embodiment explained with reference to FIGS. 1 and 2, the effect of the underlying film of the CrSi thin-film resistance 25 is suppressed significantly.

In the embodiment explained with reference to FIGS. 11 and 12, the CrSi thin-film resistance 25 carries the CrSiN film pattern 39 as the protective insulation film, while it should be noted that the protective film according to the semiconductor device of the second mode of the present invention and according to the fabrication process of the second aspect of the present invention is not limited to such a CrSiN film.

For example, it is possible to provide a

Figure 13A:
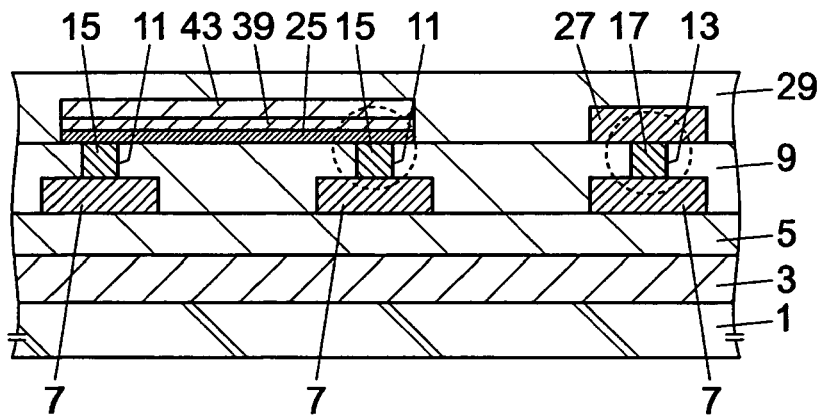
Figure 13B:
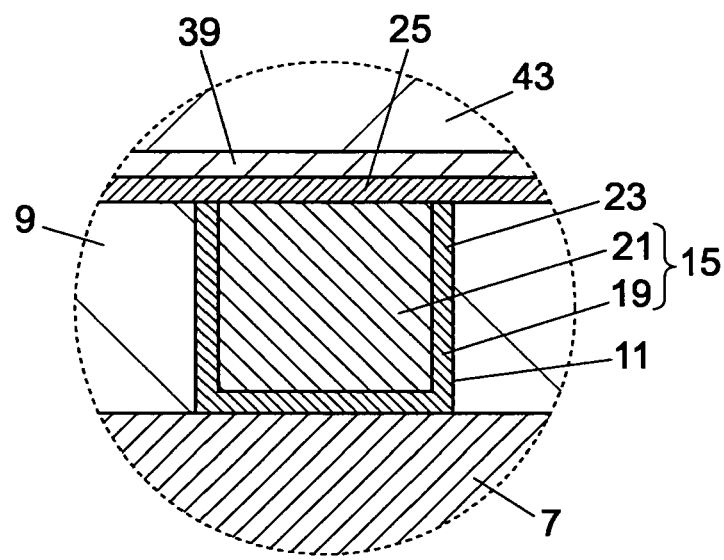
Figure 13C:
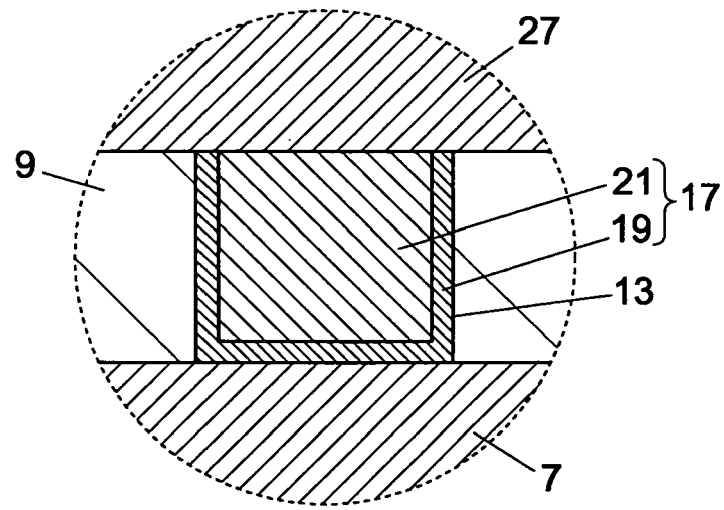
Figure 14A:
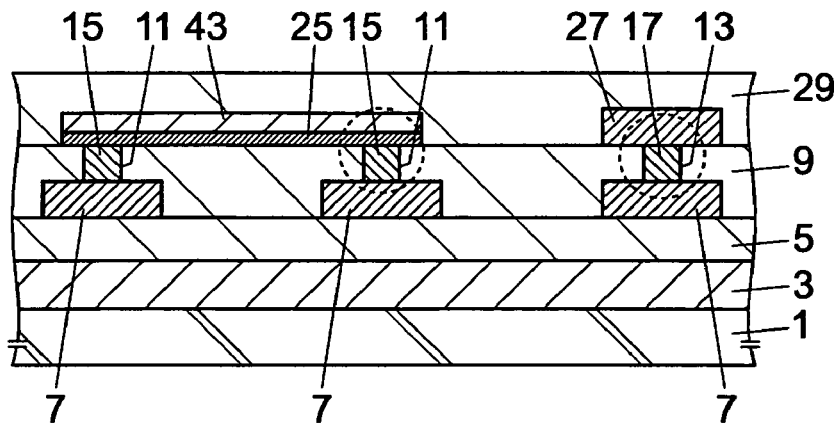
Figure 14B:
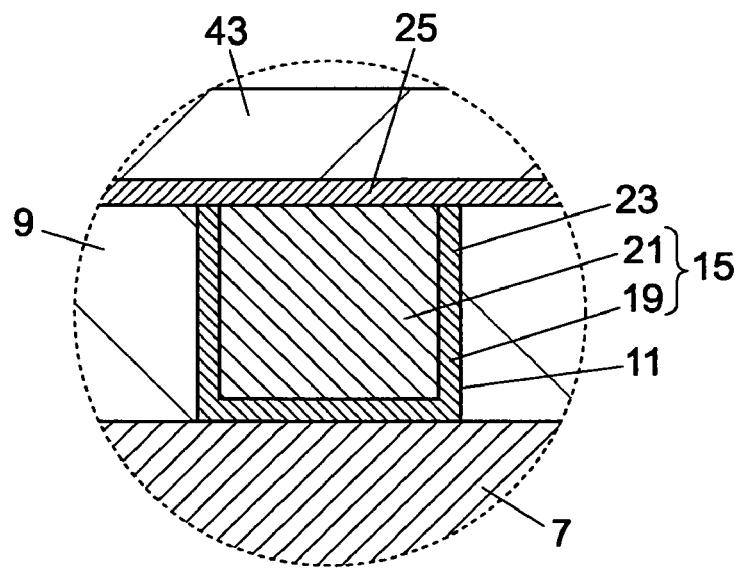
Figure 14C:
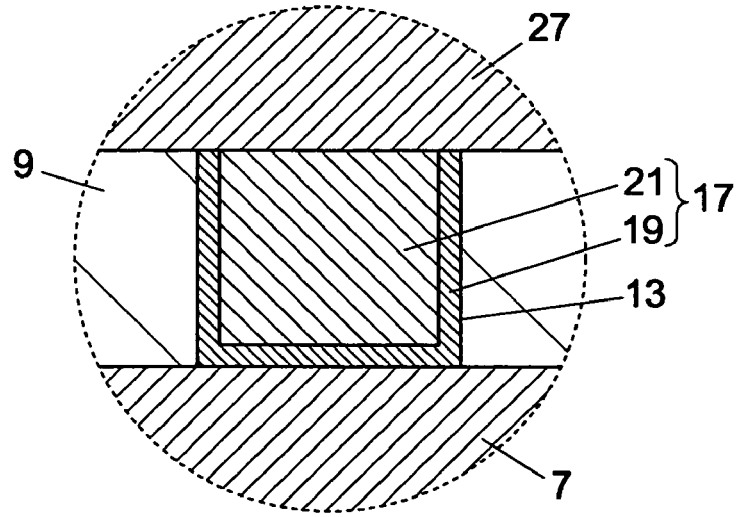

CVD insulation film such as a silicon nitride film pattern 43 further n the CrSiN film pattern 39 on the top surface of the CrSi thin-film resistance 25 as shown in FIG. 13. In this case, both the CrSiN film pattern 39 and the silicon nitride film pattern 43 are used for the protective insulation film.

The silicon nitride film pattern 43 may be formed by forming a silicon nitride film, after formation of the CrSiN film 41 according to the step (2) explained with reference to FIG. 12B, on such a CrSiN film 41 with the thickness of 2000 Angstroms and patterning the silicon nitride film thus formed, the CrSiN film 41 and further CrSi thin-film 35 to form a laminated pattern in which the CrSi thin-film resistance 25, the CrSiN film pattern 39 and a silicon nitride film pattern 43 are laminated consecutively. As a result of the existence of the silicon nitride film pattern 43, it becomes possible to prevent the etching of the CrSi thin-film resistance at the time of the patterning of the second-layer metal interconnection pattern 27.

Here, it should be noted that formation of the silicon nitride film for the silicon nitride film pattern 43 may be conducted in continuation with the formation of the CrSiN film for the CrSiN film pattern 41 without breaking the vacuum. Alternatively, it is possible to break the vacuum after formation of the CrSiN film for the CrSiN film pattern 41 and move the wafer to a CVD chamber for formation of the silicon nitride film for the silicon nitride film pattern 43 on the CrSiN film pattern 39. Thereby, it should be noted that there occurs no oxidation in the CrSi thin-film used for the CrSi thin-film resistance 25 even when the vacuum is broken after formation of the CrSiN film for the CrSiN film pattern 41 as the CrSi thin-film is already covered with the CrSiN film. Further, the insulation film formed on the CrSiN film pattern 39 is not limited to a silicon nitride film but other insulation film such as a silicon oxide film may be used.

Further, it is also possible that the foregoing protective insulation film lacks the CrSiN film 41. In this case, the protective insulation film is formed only of an insulation film on the CrSi thin-film resistance 25, such as the silicon nitride film pattern 43. Formation of the silicon nitride film pattern 43 in such a case may be conducted by the steps of forming a silicon nitride film directly on the CrSi thin-film 35, after formation of the CrSi thin-film 35 in the step (2) explained with reference to FIG. 12B, without forming the CrSiN film 41. With this, it is possible to form a laminated pattern in which the CrSi thin-film resistance 25 and the silicon nitride film pattern 43 are laminated.

While the embodiments described heretofore with reference to FIGS. 1-13 have been described in relation to the cases of applying the present invention to the semiconductor device in which there is provided a two-layer metal interconnection pattern for the metal interconnection, the present invention is by no means limited to this and the present invention is applicable also to the semiconductor devices having a multilayer metal interconnection structure including three or more interconnection layers. Thereby, the metal interconnection pattern formed with the same layer of the metal thin-film resistance may be in any of the layers of the multilayer metal interconnection.

In the case of applying the present invention to a semiconductor device having a multilayer metal interconnection structure, it becomes possible to increase the degree of freedom of design by choosing the metal interconnection pattern formed with the same layer of the metal thin-film resistance to be the uppermost interconnection pattern. In such a case, it becomes possible to change the layout of the metal thin-film resistance by way of layout change of the metal thin-film resistance and the uppermost interconnection pattern.

Further, by disposing the metal thin-film resistance with the same layer as the uppermost interconnection pattern, there is formed a final protective film of insulation material on the metal thin-film resistance, and it becomes possible to reduce the thickness of the insulation material as well as the variation of thickness of such an insulation material formed on the metal thin-film resistance, as compared with the case in which there is formed other insulation film than the final protective film on the metal thin-film resistance.

With this, it becomes possible, at the time of applying a trimming processing to the metal thin-film resistance by irradiating a laser beam thereto, to reduce the variation of laser energy applied to the metal thin-film resistance caused by variation of laser beam interference by the insulation material on the metal thin-film resistance. Thereby, precision of trimming is improved. Further, it becomes possible to improve the efficiency of heat dissipation at the time of the trimming processing for dissipating heat caused by the laser irradiation and associated temperature rise.

Further, with the present embodiment, it should be noted that the first layer metal interconnection pattern 7 is not limited to the AlSiCu alloy. For example, it is possible to use a metal pattern carrying a refractory metal film thereon for the metal interconnection pattern. Further, the metal interconnection pattern is not limited to the one that uses an Al alloy but it is also possible to use an interconnection patter of other metal material such as the Cu interconnection formed by so-called damascene process for the metal interconnection pattern.

Further, it should be noted that while the foregoing embodiment uses the first-layer metal interconnection pattern 7 for the interconnection pattern for providing the electric potential to the CrSi thin-film resistance 25, it is also possible to use a polysilicon pattern or an impurity diffusion layer formed in the silicon substrate or epitaxial growth layer in place of the first-layer metal interconnection pattern 7.

Figure 15A:
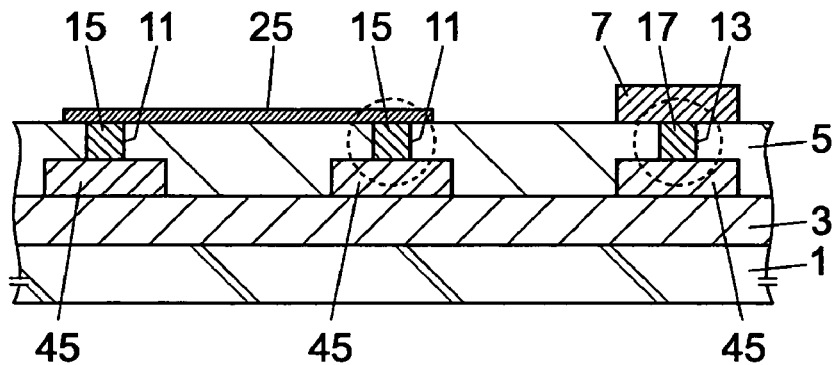
Figure 15B:
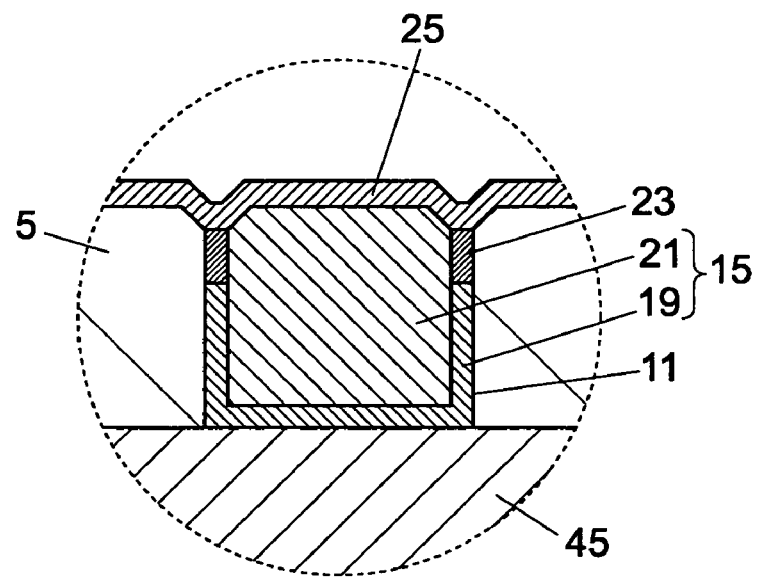
Figure 15C:
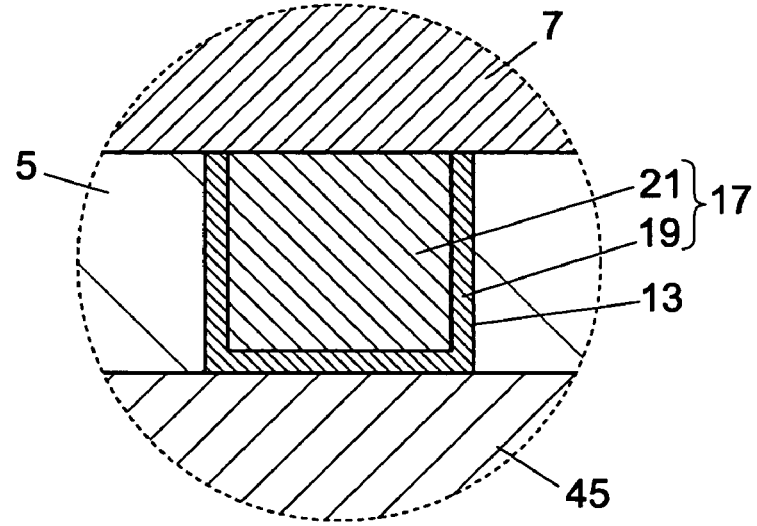
Figure 16A:
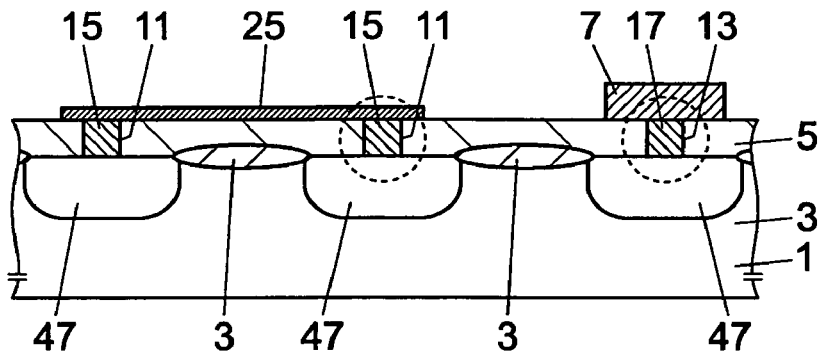
Figure 16B:
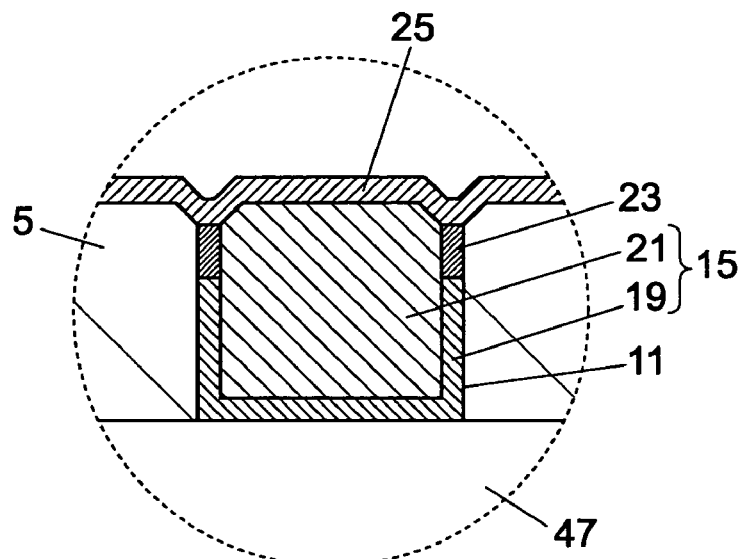
Figure 16C:
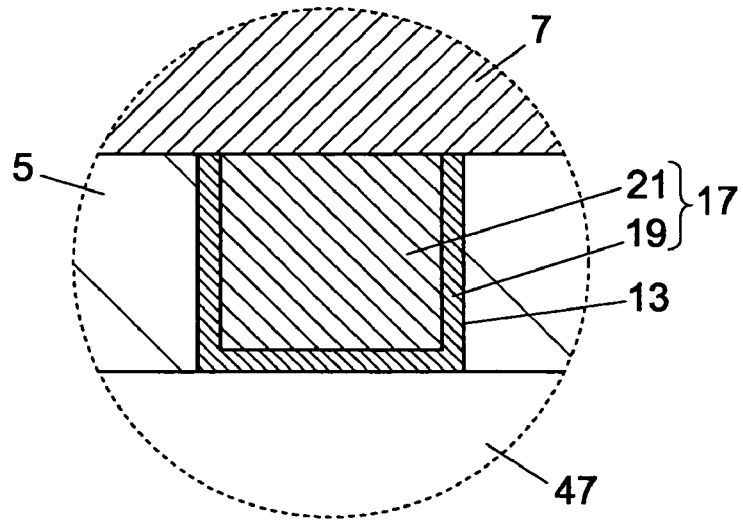

For example, it is possible to use a polysilicon pattern 45 formed on the device isolation oxide film 3 shown in FIGS. 15A-15C in the case of the first mode of the semiconductor device of the present invention. Alternatively, it is possible to use an impurity diffusion layer 47 as shown in FIGS. 16A-16C.

Further, the construction of using a polysilicon pattern or diffusion layer for the interconnection pattern for providing electric potential to the metal thin-film resistance is by no means limited to the specific construction shown in FIGS. 15 and 16 but is applicable to all the modes of the semiconductor device of the present invention and all the aspects of the fabrication process of the present invention.

In the embodiments and examples explained with reference to FIGS. 1-16, it should be noted that the metal thin-film resistance is not limited to CrSi but it is also possible to use other materials such as NiCr, TaN, $CrSi_2$, CrSiN, CrSi, CrSiO, and the like, for the material of the metal thin-film resistance.

Further, it should be noted that the first conductive plug 15 and the second conductive plug 17 of the present invention are not limited to those formed of the tungsten plug 21 and the titanium barrier metal 19. For example, it is possible to use a material other than titanium such as TiW, TiN, W, WSi, and the like, for the first conductive material (barrier metal).

Further, the second conductive material is not limited to tungsten but it is also possible to use Cu, Al, WSi, and the like. Here, the first conductive material and the second conductive material are not limited to those listed above. Further, it is possible that the first and second conductive plugs lack a barrier metal.

The metal thin-film resistance constituting the semiconductor device of the present invention and the metal thin-film resistance formed according to the process of the present invention can be used for example in a semiconductor device having an analog circuit. Hereinafter, an embodiment of the semiconductor device having an analog circuit that uses such a metal thin-film resistance will be explained.

Figure 17:
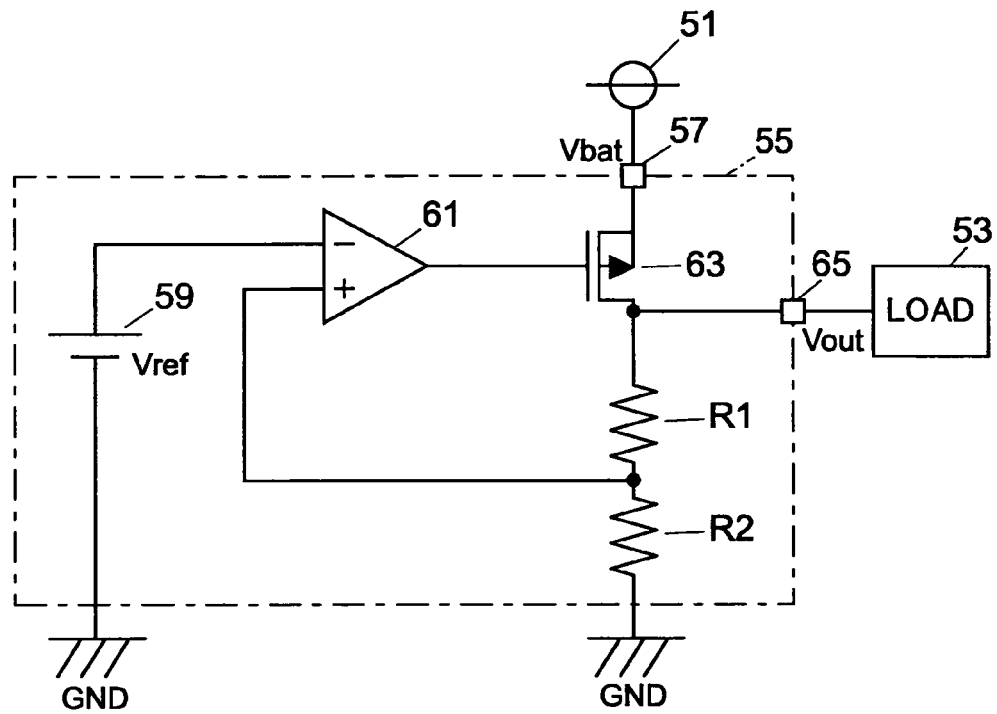
FIG. 17 is a circuit diagram showing an embodiment of the semiconductor device having an analog circuit forming a constant voltage generator.

FIG. 17 is a circuit diagram showing an embodiment of the semiconductor device having an analog circuit that forms a constant voltage generator.

Referring to FIG. 17, there is provided a constant voltage generator 55 for supplying a stabilized power from a D.C. power supply 51 to a load 53. Thereby, it should be noted that the constant voltage generator 55 includes: an input terminal (Vbat) 57 to which the D.C. power supply 51 is connected; a reference voltage generator (Vref); an operational amplifier (comparator) 61, a p-channel MOS transistor (designated hereinafter as PMOS) 63 constituting an output driver; voltage dividers R1 and R2; and an output terminal (Vout) 65.

In the operational amplifier 61 of the constant voltage generator, the output terminal thereof is connected to the gate electrode of the PMOS 63 and the reference voltage Vref of the reference voltage generator 59 is supplied to an inversion input terminal (−) thereof. Further, a voltage obtained by dividing the output voltage Vout by the resistance elements R1 and R2 is supplied to the non-inversion input terminal (+) thereof, and the voltage dividend out by the resistance elements R1 and R2 is controlled to be equal to the reference voltage Vref.

Figure 18:
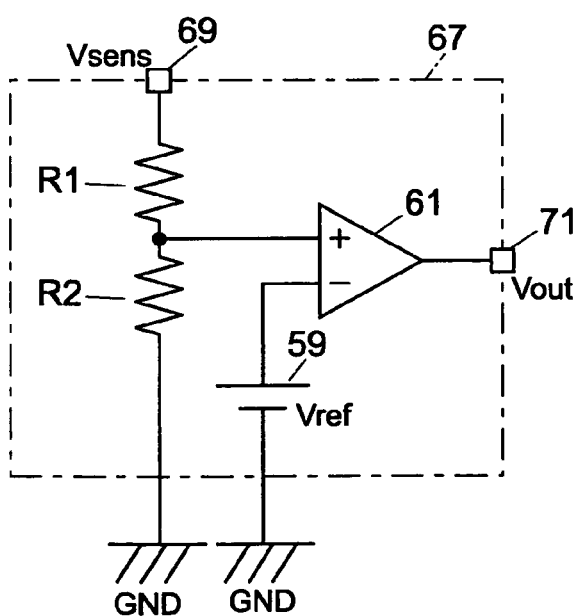
FIG. 18 is a circuit diagram showing an embodiment of the semiconductor device having an analog circuit forming a voltage detector.

FIG. 18 is a circuit diagram showing an embodiment of the semiconductor device having an analog voltage detector 67.

Referring to FIG. 18, the voltage detector 67 includes an operational amplifier 61 having an inversion input terminal (−) connected to a reference voltage gubernator 59, wherein the inversion input terminal is supplied with a reference voltage Vref from the reference voltage generator 59. Further, the voltage of an input terminal 69 supplied for voltage detection is divided by the resistances R1 and R2 and the divided voltage is supplied to a non-inversion input terminal (+) of the operational amplifier 61. The output of the operational amplifier 61 is output via an output terminal (Vout) 71.

In such a voltage detector 67, it should be noted that the output of the operational amplifier 61 maintains a high level state (H) in the case the input voltage of the input terminal for voltage detection is high and the divided voltage divided out by the resistances R1 and R2 is higher than the reference voltage Vref. On the other hand, when the voltage to be mea reused has dropped and the voltage divided by the resistance elements R1 and R2 has decreased below the reference voltage Vref, the output of the operational amplifier 61 turns to the low level state (L).

Generally, the constant voltage generator of FIG. 17 or the voltage detector of FIG. 18 uses an adjustable resistance circuit capable of changing the resistance value thereof by selectively disconnecting a fuse element for the voltage divider in view of variation of the reference voltage Vref of the reference voltage generator caused by the variation at the time of the fabrication process.

Figure 19:
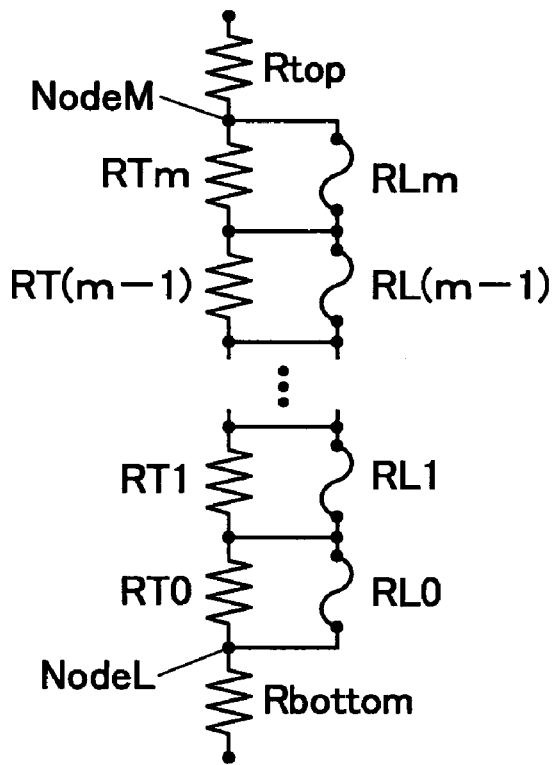
FIG. 19 is a circuit diagram showing an embodiment of the semiconductor device having an analog circuit forming a voltage divider.
Figure 20:
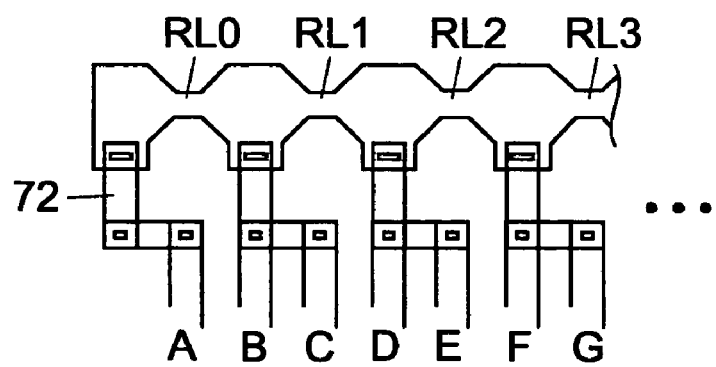
FIG. 20 is a layout diagram showing an example of layout of the fuse element forming a part of the voltage divider.
Figure 21:
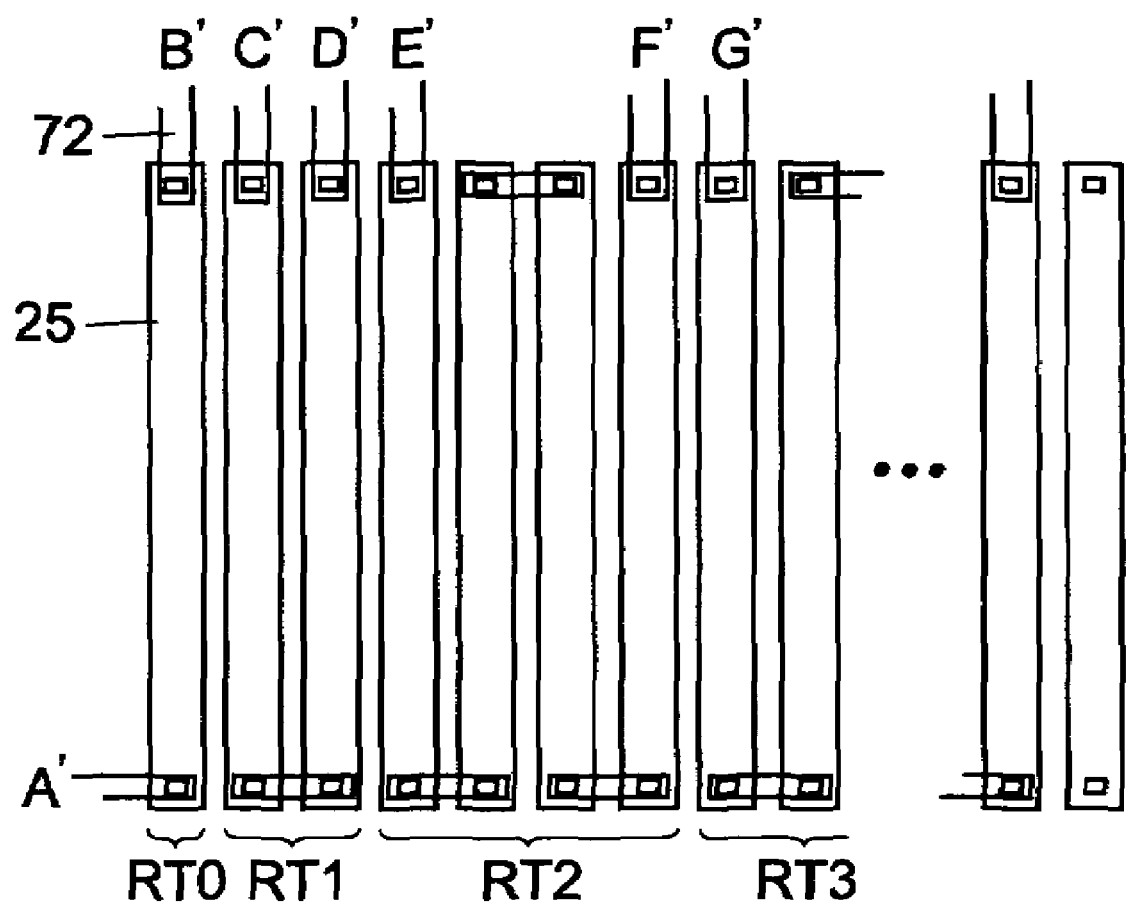
FIG. 21 is a layout diagram showing an example of layout of the metal thin-film resistance in the voltage divider.
Figure 22A:
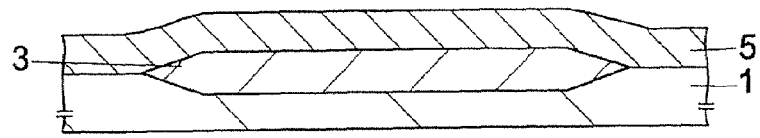
FIGS. 22A-22F are cross-sectional diagrams explaining a conventional process of fabricating a semiconductor device.
Figure 22B:
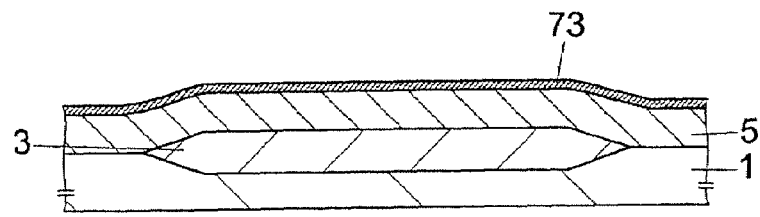
Figure 22C:
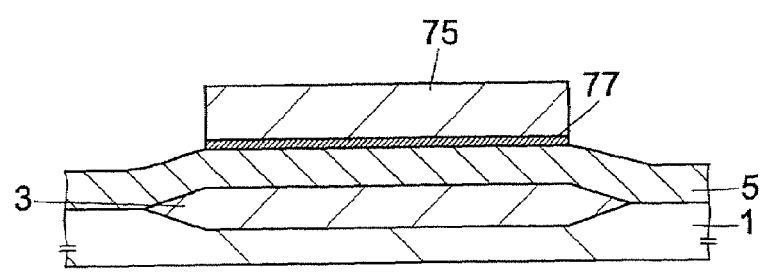
Figure 22D:
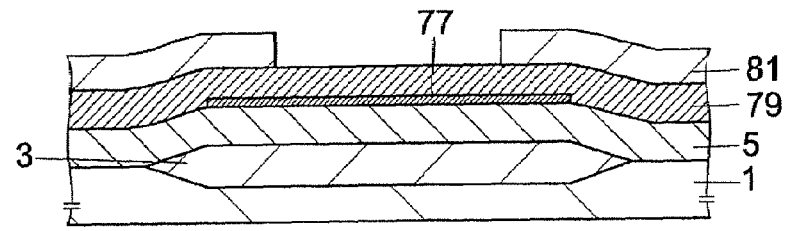
Figure 22E:
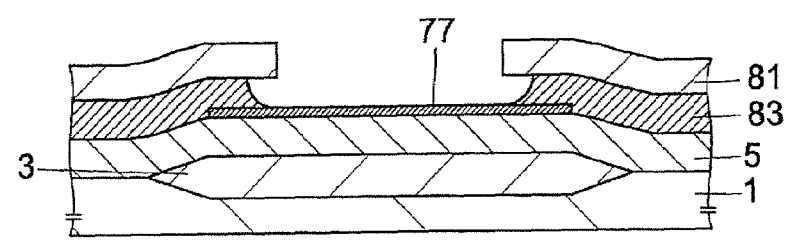
Figure 22F:
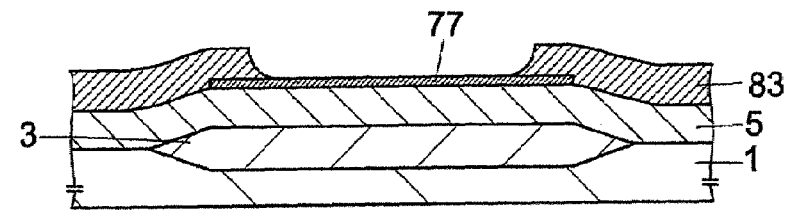
Figure 23A:
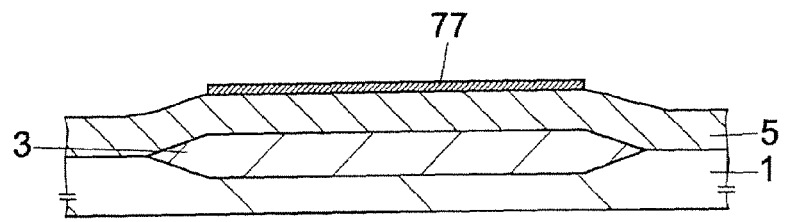
FIGS. 23A-23F are cross-sectional diagrams explaining other conventional process of fabricating a semiconductor device.
Figure 23B:
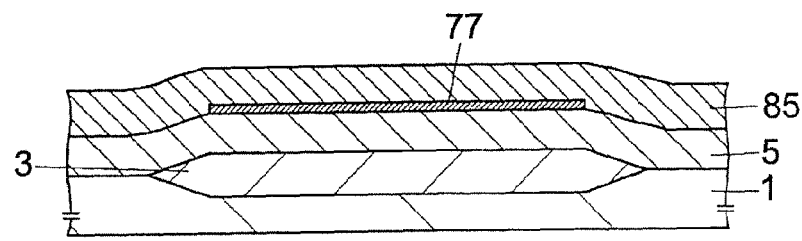
Figure 23C:
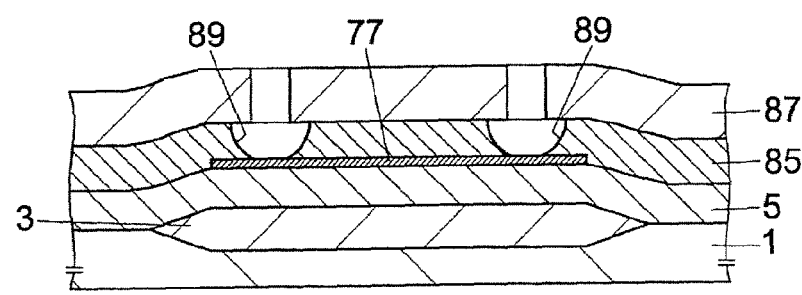
Figure 23D:
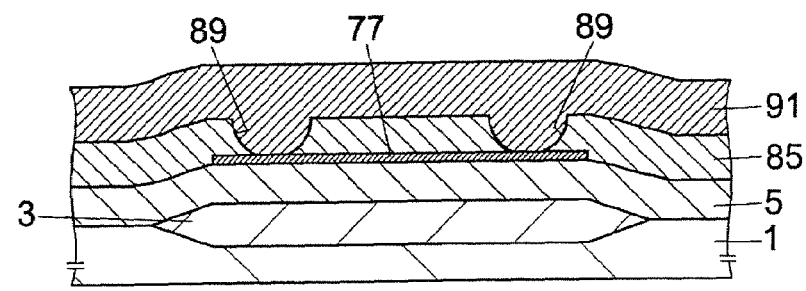
Figure 23E:
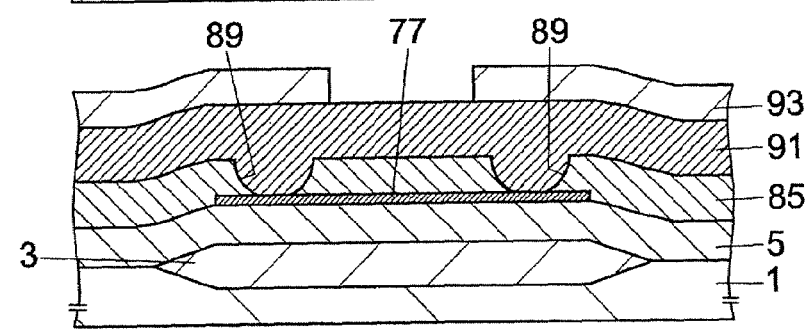
Figure 23F:
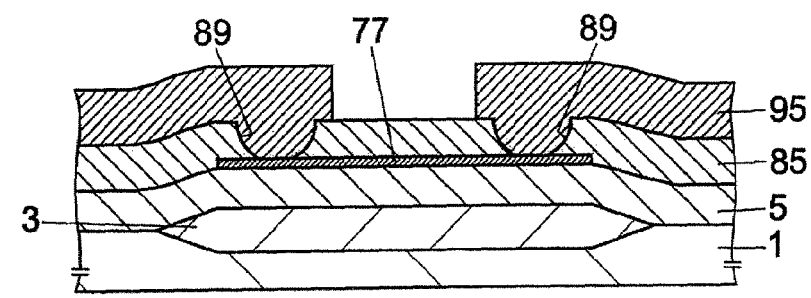
Figure 24A:
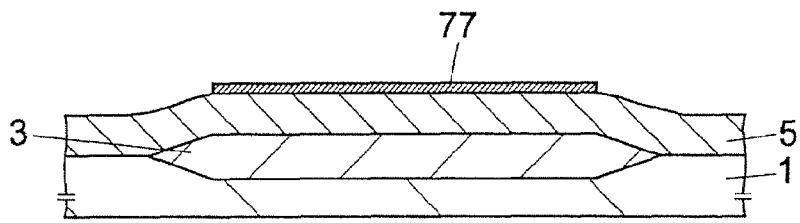
FIGS. 24A-24E are cross-sectional diagrams explaining other conventional process of fabricating a semiconductor device.
Figure 24B:
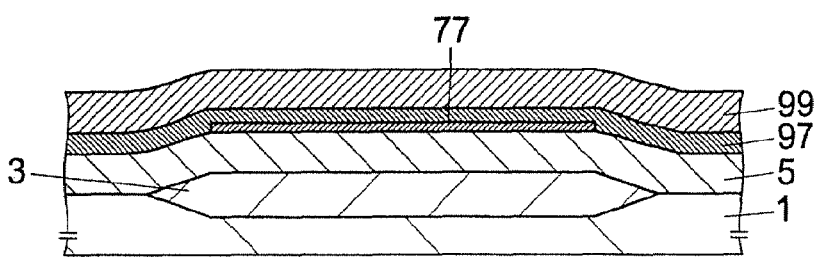
Figure 24C:
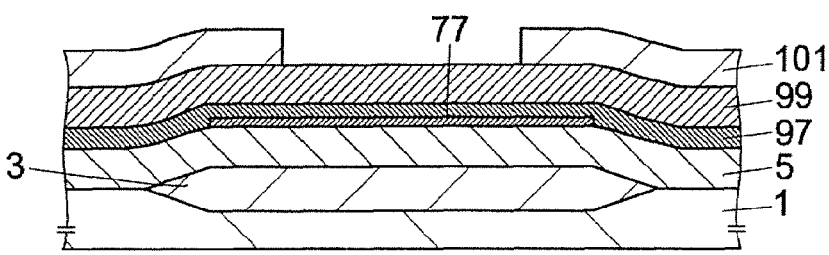
Figure 24D:
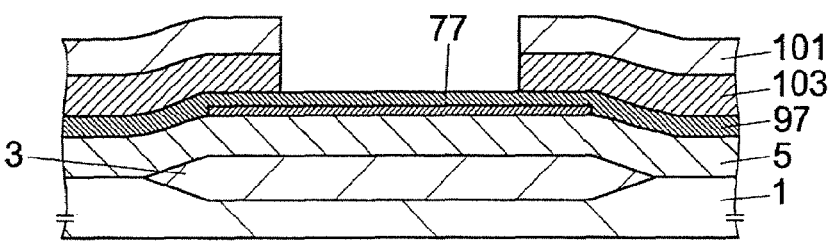
Figure 24E:
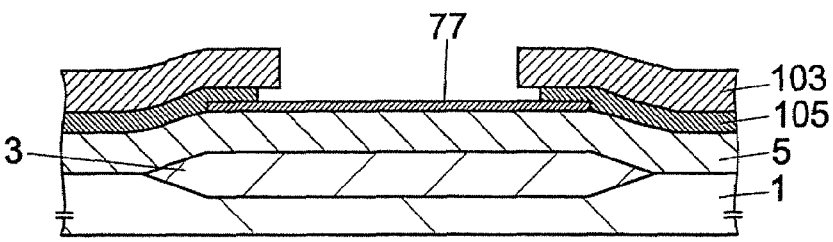
Figure 25A:
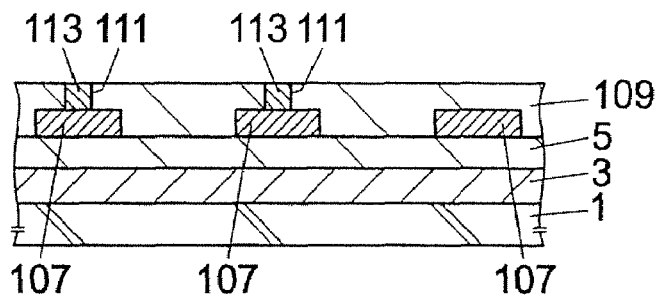
FIGS. 25A-25E are cross-sectional diagrams explaining further conventional process of fabricating a semiconductor device.
Figure 25B:
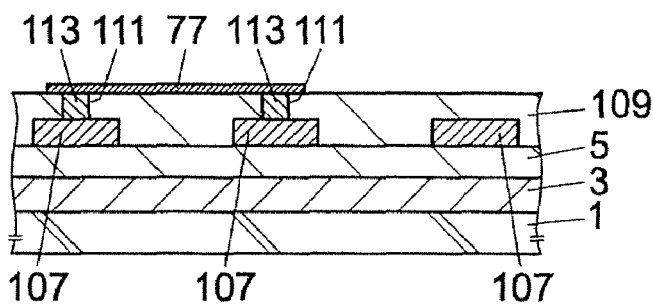
Figure 25C:
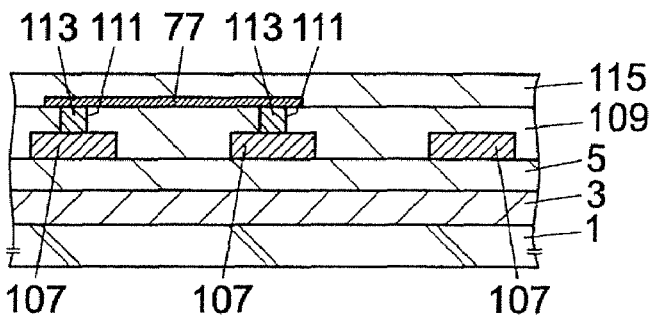
Figure 25D:
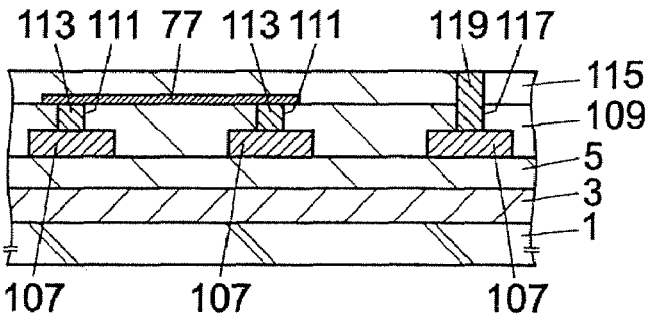
Figure 25E:
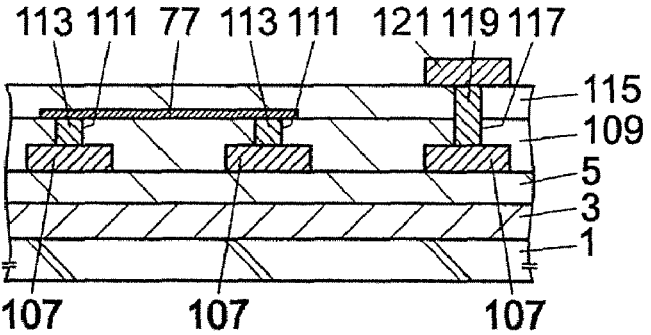
Figure 26A:
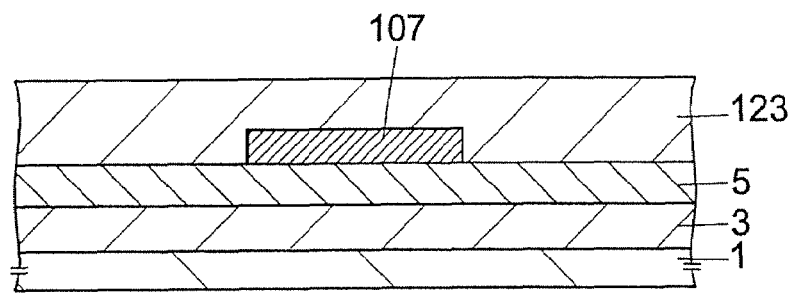
FIGS. 26A-26D are cross-sectional diagrams showing further conventional process of fabricating a semiconductor device.
Figure 26B:
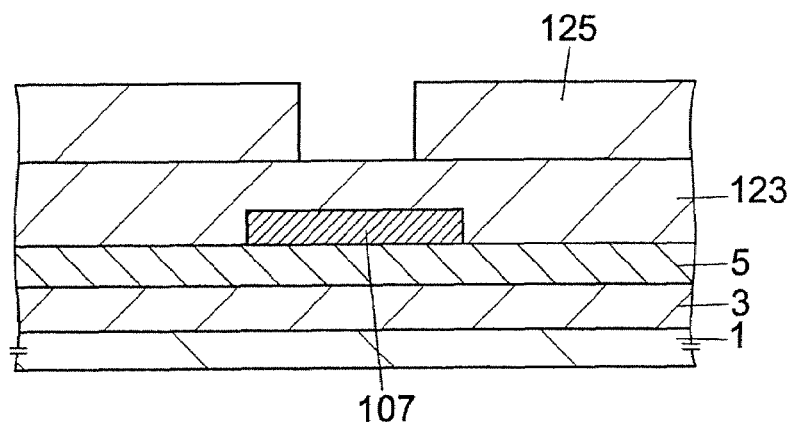
Figure 26C:
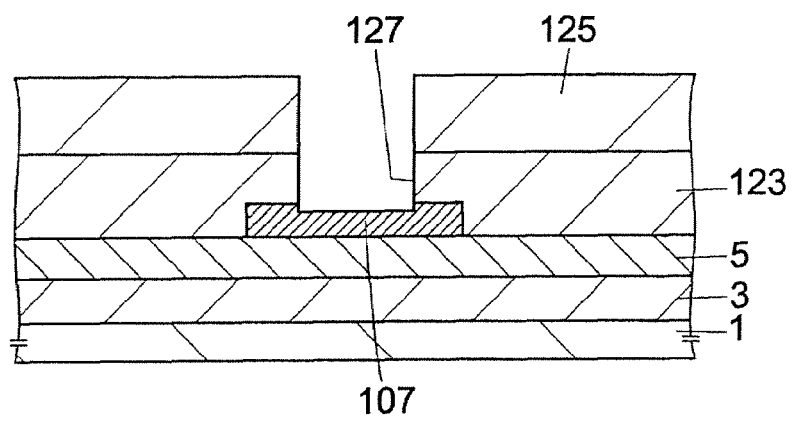
Figure 26D:
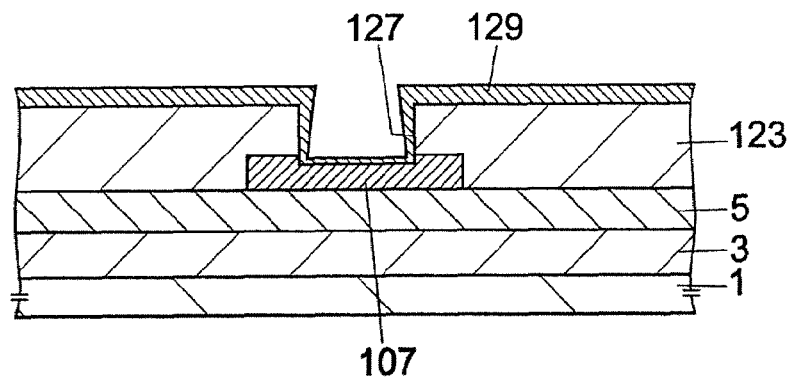

FIG. 19 is a circuit diagram showing an example of such an adjustable resistance circuit to which the metal thin-film resistance of the present invention is applied, while FIGS. 20 and 21 are layout diagrams showing the examples of layout of the adjustable resistance circuit. Thereby, FIG. 20 shows the layout of the part of the fuse element while FIG. 21 shows the layout of the part of the resistance element.

As shown in the circuit diagram of FIG. 19, the adjustable resistance circuit includes a serial connection of m+1 resistance elements RT0, RT1, ..., RTm inserted between a resistance element Rbottom and a resistance element Rtop, wherein it will be noted that the resistance elements RT0, RT1, ..., RTm are provided with respective fuse elements RL0, RL1, ..., RLm in parallel therewith.

As shown in FIG. 20, each of the fuse elements RL0, RL1, ..., RLm is formed of a polysilicon pattern having a sheet resistance of 20-40 Ω.

Thereby, the resistance value of the resistance elements RT0, RT1, ..., RTm is set such that the resistance value thereof increases twice in element to element in the direction form the resistance element Rbottom to the resistance element Rtop. Thus, the resistance element RTn has a resistance value of 2n times as large as the resistance value of the resistance element RT0.

For example, the resistance element R0 is formed of a single CrSi thin-film resistance element 25 of the CrSi thin-film. In this case, therefore, the resistance RTn is formed of 2n CrSi thin-film resistance elements 25. Reference should be made to FIG. 21.

For the CrSi thin-film resistance 25, any of the construction shown in FIGS. 1A-1C, FIGS. 8A-8C, FIGS. 9A-9C, FIGS. 11A-11C, FIGS. 13A-13C, FIGS. 14A-14C, FIGS. 15A-15C and FIGS. 16A-16C may be used.

In FIGS. 20 and 21, it should be noted that electrical connection between strip A and strip A', strip B and strip B', strip C and strip C', strip D and strip D', strip E and strip E', strip F and strip F', and strip G and strip G' is achieved by using respective metal interconnection patterns 72.

Thus, with the voltage divider in which the resistance ratio between different resistance elements is important, a number of unit resistance elements, each formed of a pair of resistance element and a fuse element, is connected in serried and are arranged in a ladder-like form to form the adjustable resistance circuit.

In such an adjustable resistance circuit, a desired serial resistance value is obtained by disconnecting one or more suitable fuse elements RL0, RL1, ..., RLm by using a laser beam.

According to the metal thin-film resistance constituting the semiconductor device of the present invention, it becomes possible to realize miniaturization and stabilization of the metal thin-film resistance, and thus, it becomes possible to decrease the area occupied by the voltage divider of FIG. 19 and improve the precision of output voltage.

Thus, when the voltage divider of FIG. 19 is to be used for the resistances R1 and R2 of the constant voltage circuit of FIG. 17, the end of the resistance element Rbottom is grounded and the end of the resistance element Rtop is connected to the drain of PMOS 71. Further, a node NodeL between the resistance elements Rbottom and RT0 or a node NodeM between the resistance elements Rtop and NnodeM is connected to the non-inverting input terminal of the operational amplifier 61.

With the use of the voltage divider thus formed of the metal thin-film resistance of the present invention, the precision of the output voltage divided out by the resistance elements R1 and R2 is improved, and thus, the stability of output voltage of the constant voltage generator 55 is improved. Further, with decrease of the area occupied by the voltage divider, it becomes possible to decrease the area of the constant voltage generator 55.

When the voltage divider of FIG. 19 is to be used for the resistance elements R1 and R2 of the voltage detector, the end of the resistance element Rbottom is grounded and the end of the resistance element Rtop is connected to the input terminal 77. Further, the node NodeL between the resistance element Rbottom and the resistance element RT0 or the node NodeM between the resistance element Rtop and the resistance element RTm is connected to the non-inverting input terminal of the operational amplifier 61.

As a result of use of the voltage divider that uses the metal thin-film resistance of the present invention, it is possible to improve the precision of the resistance elements R1 and R2 and the precision of voltage detection by the voltage detector 67 is improved. Further, with miniaturization of the area occupied by the voltage divider circuit, it becomes possible to reduce the area of the voltage detector 67.

It should be noted that the semiconductor device to which the voltage divider circuit that uses the metal thin-film resistance of the present invention is applied is by no means limited to such a semiconductor device having a constant voltage generator or a semiconductor having a voltage detector, but the present invention is applicable to any semiconductor device as long as the semiconductor device is the one having the voltage divider.

Further, the semiconductor device to which the metal thin-film resistance of the present invention is applied is by no means to a semiconductor device having a voltage divider but the present invention is applicable to any semiconductor device as long as it has a metal thin-film resistance. For example, the metal thin-film resistance of the present invention can be used as a resistance element in which the resistance value thereof is adjusted by disconnecting or modifying the resistance by irradiation of a laser beam thereto.

In the description theretofore, it should be noted that the dimension, shape, material, layout, or the like explained heretofore with reference to various embodiments of the present invention are only for the exemplary purposes, and various modifications may be made within the scope of the present invention.

The present invention is based on Japanese priority application 2004-042782 filed on Feb. 19, 2004, the entire contents thereof being incorporated herein as reference.

What is claimed is:

1. A semiconductor device having a metal thin-film resistance on an insulation film, comprising:
    first, second, and third contact holes formed in said insulation film;
    a first conductive plug formed in said first contact hole;
    a second conductive plug formed in said second contact hole;
    a third conductive plug formed in said third contact hole;
    a metal thin-film resistance formed on said first and second conductive plugs and on said insulation film; and
    a metal interconnection pattern formed on said third conductive plug and said insulation film; and
    wherein said first conductive plug comprises a first conductive material formed on an inner wall surface of said first contact hole and a second conductive material formed on said first conductive material in said first contact hole, said second conductive plug comprises said first conductive material formed on an inner wall surface of said second contact hole and said second conductive material formed on said first conductive material in said second contact hole,
    a top edge of said first conductive material in said first contact hole is formed with a separation from a top edge of said first contact hole and a top surface of said second conductive material,
    an outer peripheral part of said top surface of said second conductive material in said first contact hole and said top edge of said first contact hole forming a tapered surface,
    wherein there is formed a buried material in said first contact hole in a space formed on said first conductive material between said inner wall of said first contact hole and said second conductive material in said first contact hole, such that said buried material contains at least a material of said insulation film, said first conductive material and Ar as a component thereof.

2. The semiconductor device as claimed in claim 1, further comprising a metal nitride film covering a top surface of said metal thin-film resistance, no metal oxide being formed between said top surface of said metal thin-film resistance and said metal nitride film.

3. The semiconductor device as claimed in claim 1, further comprising a protective insulation film on said metal thin-film resistance.

4. The semiconductor device as claimed in claim 3, further comprising a metal nitride film between said metal thin-film resistance and said protective insulation film, no metal oxide film being formed between said top surface of said metal thin-film resistance and said metal nitride film.

5. The semiconductor device as claimed in claim 3, further comprising a metal nitride film as said protective insulation film, no metal oxide film being formed between said top surface of said metal thin-film resistance and said metal nitride film.

6. The semiconductor device as claimed in claim 1, wherein said metal interconnection pattern constitutes an uppermost metal interconnection pattern of said semiconductor device.

7. The semiconductor device having a voltage divider circuit including two or more resistance elements and producing a divided voltage output, said resistance voltage divider being capable of adjusting said divided voltage output by disconnecting a fuse element, at least one of said resistance elements comprising a metal thin-film resistance formed on an insulation film, comprising:
    first, second, and third contact holes formed in said insulation film;
    a first conductive plug formed in said first contact hole;
    a second conductive plug formed in said second contact hole;
    a third conductive plug formed in said third contact hole;
    a metal thin-film resistance formed on said first and second conductive plugs and on said insulation film; and
    a metal interconnection pattern formed on said third conductive plug and said insulation; and
    wherein said first conductive plug comprises a first conductive material formed on an inner wall surface of said first contact hole and a second conductive material formed on said first conductive material in said first contact hole, said second conductive plug comprises said first conductive material formed on an inner wall surface of said second contact hole and said second conductive material formed on said first conductive material in said second contact hole,
    a top edge of said first conductive material in said first contact hole is formed with a separation from a top edge of said first contact hole and a top surface of said second conductive material,
    an outer peripheral part of said top surface of said second conductive material in said first contact hole and said top edge of said first contact hole forming a tapered surface,
    wherein there is formed a buried material in said first contact hole in a space formed on said first conductive material between said inner wall of said first contact hole and said second conductive material in said first contact hole, such that said buried material contains at least a material of said insulation film, said first conductive material and Ar as a component thereof.

8. A semiconductor device having a voltage detector, said voltage detector comprising:
    a voltage divider for dividing an input voltage and producing a divided voltage;
    a reference voltage generator producing a reference voltage; and
    a comparator comparing said divided voltage of said voltage divider and said reference voltage from said reference voltage generator, said voltage divider including two or more resistance elements for producing divided voltage, at least one of said resistance elements comprising a metal-thin film resistance formed on an insulation film, comprising:

first, second, and third contact holes formed in said insulation film;

a first conductive plug formed in said first contact hole;

a second conductive plug formed in said second contact hole;

a third conductive plug formed in said third contact hole;

a metal thin-film resistance formed on said first and second conductive plugs and on said insulation film; and a metal interconnection pattern formed on said third conductive plug and said insulation; and wherein said first conductive plug comprises a first conductive material formed on an inner wall surface of said first contact hole and a second conductive material formed on said first conductive material in said first contact hole, said second conductive plug comprises said first conductive material formed on an inner wall surface of said second contact hole and said second conductive material formed on said first conductive material in said second contact hole, a top edge of said first conductive material in said first contact hole is formed with a separation from a top edge of said first contact hole and a top surface of said second conductive material, an outer peripheral part of said top surface of said second conductive material in said first contact hole and said top edge of said first contact hole forming a tapered surface, wherein there is formed a buried material in said first contact hole in a space formed on said first conductive material between said inner wall of said first contact hole and said second conductive material in said first contact hole, such that said buried material contains at least a material of said insulation film, said first conductive material and Ar as a component thereof.

9. A semiconductor device having a constant voltage generator, said constant voltage generator comprising:

an output driver supplied with an input voltage and producing an output voltage, a voltage divider dividing out said output voltage and producing a divided voltage;

a reference voltage generator for producing a reference voltage; and a comparator comparing said divided voltage of said voltage divider with said reference from said reference voltage generator, said comparator controlling said output driver in response to a result of comparison of said comparator, said voltage divider including two or more resistance elements, at least one of said resistance elements comprising a metal thin-film resistance formed on an insulation film, comprising:

first, second, and third contact holes formed in said insulation film;

a first conductive plug formed in said first contact hole;

a second conductive plug formed in said second contact hole;

a third conductive plug formed in said third contact hole;

a metal thin-film resistance formed on said first and second conductive plugs and on said insulation film; and a metal interconnection pattern formed on said third conductive plug and said insulation film; and wherein said first conductive plug comprises a first conductive material formed on an inner wall surface of said first contact hole and a second conductive material formed on said first conductive material in said first contact hole, said second conductive plug comprises said first conductive material formed on an inner wall surface of said second contact hole and said second conductive material formed on said first conductive material in said second contact hole, a top edge of said first conductive material in said first contact hole is formed with a separation from a top edge of said first contact hole and a top surface of said second conductive material, an outer peripheral part of said top surface of said second conductive material in said first contact hole and said top edge of said first contact hole forming a tapered surface, wherein there is formed a buried material in said first contact hole in a space formed on said first conductive material between said inner wall of said first contact hole and said second conductive material in said first contact hole, such that said buried material contains at least a material of said insulation film, said first conductive material and Ar as a component thereof.

* * * * *